US007362089B2

(12) United States Patent
Kushnick et al.

(10) Patent No.: US 7,362,089 B2
(45) Date of Patent: Apr. 22, 2008

(54) CARRIER MODULE FOR ADAPTING NON-STANDARD INSTRUMENT CARDS TO TEST SYSTEMS

(75) Inventors: Eric Barr Kushnick, Santa Clara, CA (US); Yasuo Furukawa, Meiwa-machi (JP); Lawrence Kraus, Santa Clara, CA (US); James Getchell, Santa Clara, CA (US)

(73) Assignee: Advantest Corporation, Ora-Gun (JP)

( * ) Notice: Subject to any disclaimer, the term of this patent is extended or adjusted under 35 U.S.C. 154(b) by 179 days.

(21) Appl. No.: 10/912,848

(22) Filed: Aug. 6, 2004

(65) Prior Publication Data

US 2005/0261856 A1 Nov. 24, 2005

Related U.S. Application Data

(60) Provisional application No. 60/573,121, filed on May 21, 2004.

(51) Int. Cl.
*G01R 31/28* (2006.01)
(52) U.S. Cl. .................................................. 324/158.1
(58) Field of Classification Search .................. None
See application file for complete search history.

(56) References Cited

U.S. PATENT DOCUMENTS 6,028,439 A    2/2000   Arkin et al.
6,462,532 B1   10/2002   Smith
6,587,979 B1 *   7/2003   Kraus et al. ................ 714/720

OTHER PUBLICATIONS

Rajsuman, R. "An Overview of The Open Architecture Test System", Proceedings Delta 2004, Second IEEE International Workshop on Electronic Design, Test and Applications IEEE COMPUT. SOC, Los Alamitos, CA, Jan. 30, 2004, pp. 341-346.

Stora, M.E., "ATE Open System Platform IEEE P1552 Structured Architecture For Test Systems (SATS)," Institute of Electrical and Electronics Engineers, Autotestcon 2003 Proceedings. Sep. 22-25, 2003, IEEE Systems Readiness Technology Conference, New York, NY, pp. 85-94.

Rajsuman, R, "New Opportunity With The Open Architecture Test System", Design Automation Conference, 2004. Proceedings of the ASP-DAC 2004. Asia and South Pacific, Yokohama, Japan, Jan. 20-27, 2004, Piscataway, NJ, p. 335.

Lauterbach, M.J., "Building and Automated Test System Using Modular Signal Sources and Digitizers", Autotestcon 2003 Proceedings. IEEE Systems Readiness Technology Conference, Anaheim, CA, Sep. 22-25, 2003, pp. 72-76.

* cited by examiner

*Primary Examiner*—Ha Tran Nguyen
*Assistant Examiner*—Trung Q. Nguyen
(74) *Attorney, Agent, or Firm*—Morrison & Foerster LLP

(57) ABSTRACT

A carrier module that is able to adapt non-standard instrument cards to the architecture of a test system is disclosed. Instrument cards based on non-standard architectures may be combined on a single carrier module. The carrier module is then plugged into the test head of the test system. The carrier module provides circuitry, contained on a plug-in sub-module called an Application Interface Adapter (AIA), to interface between the instrument cards and the test head interface connector. Additionally, the AIA may also provide access from the instrument cards to ATE system calibration circuitry. The carrier module uses the standard data bus of the test system for housekeeping and control functions. A second bus provides the bus for the non-standard instrument cards. Software drivers provided with the instrument cards are encapsulated with an appropriate wrapper so that the cards run seamlessly in the software environment of the test system.

27 Claims, 17 Drawing Sheets

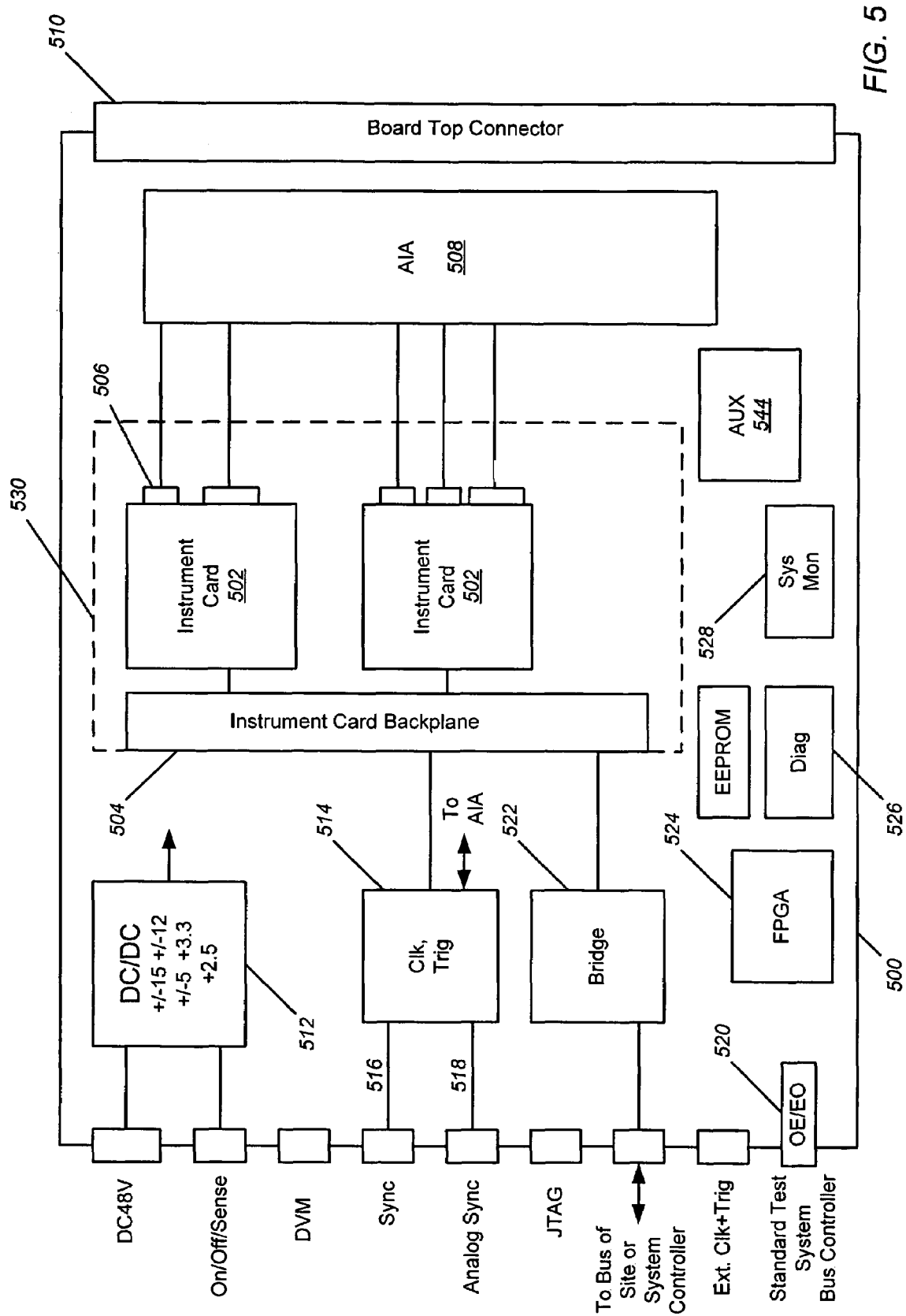

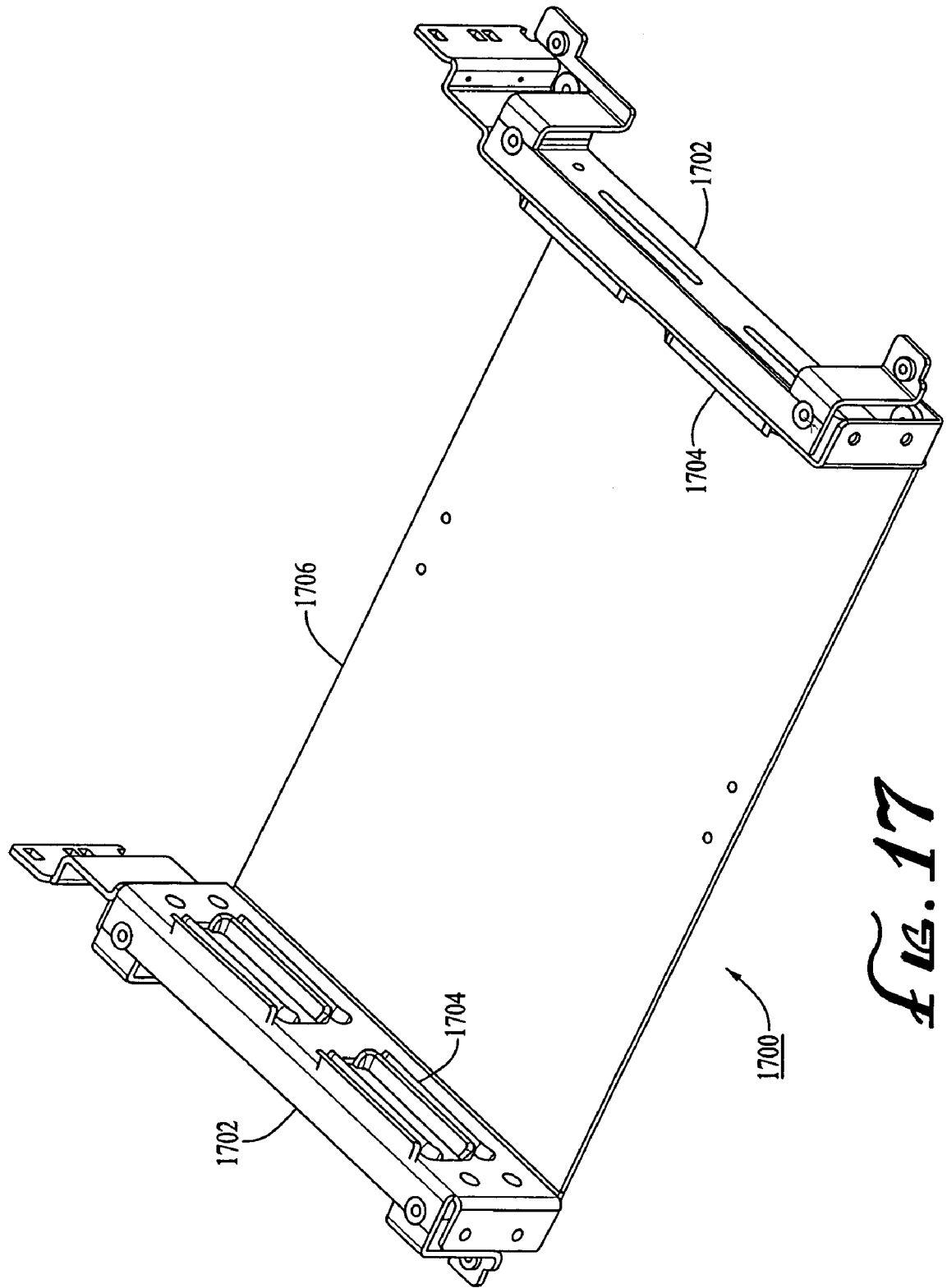

CARRIER MODULE FOR ADAPTING NON-STANDARD INSTRUMENT CARDS TO TEST SYSTEMS

CROSS-REFERENCE TO RELATED APPLICATIONS

This application claims priority to U.S. Provisional Application Ser. No. 60/573,121 filed on May 21, 2004 and entitled "Carrier Module for Adapting Non-Standard Instrument Cards to Test Systems," the contents of which are incorporated by reference herein.

FIELD OF THE INVENTION

This invention relates to a test system for testing semiconductor devices such as integrated circuits (ICs), and more particularly, to a carrier module for adapting instrument cards from other systems, architectures and protocols to test systems such as an Automatic Test Equipment (ATE) system.

BACKGROUND OF THE INVENTION

A major reason for the high cost of conventional test systems is the specialized nature of the tester architecture. Tester manufacturers typically employ a number of tester platforms that are not only incompatible across companies, but also incompatible across platforms. Because of these incompatibilities, each tester may require its own specialized hardware and software components that cannot be used on other testers.

Because of the dedicated nature of conventional tester architecture, all hardware and software must remain in a fixed configuration for a given tester. To test an IC, a dedicated test program is developed that uses some or all of the tester capabilities to define the test data, signals, waveforms, and current and voltage levels, as well as to collect the device under test (DUT) response and determine DUT pass/fail.

To increase flexibility and lower the cost of test systems, it would be desirable to connect and use pre-fabricated instrument cards from other systems and architectures within the test system, rather than design specialized hardware for the test system. For example, Peripheral Component Interconnect (PCI) eXtensions for Instrumentation (PXI) is the name of a system of electronic instruments comprised of a specified enclosure, a specified backplane and bus architecture, and plug-in cards that implement various types of instruments. PXI is a rugged personal computer (PC)-based platform for measurement and automation systems that combines PCI electrical-bus features with the rugged, modular, Eurocard mechanical-packaging of CompactPCI (cPCI), then adds specialized synchronization buses and key software features. FIG. 3 shows an example of a PXI card cage or enclosure 300, and FIG. 4 shows an example of a PXI card 400. Many companies produce a large variety of PXI instruments that perform specific functions, including programmable power supplies, arbitrary waveform generators (AWGs), digitizers (DGTs) and RF signal generators. PXI instruments are typically used as bench top test equipment, or as small functional test systems. However, they provide no means for system calibration and traceability other than self-calibration of individual PXI cards. Connections from the PXI card to an external device are generally through front panel cable connections, via BNC, SMA, SMB, or other connectors determined by the PXI card designer. PXI cards usually come with software drivers for Windows, LabView, etc. Compact PCI is similar to PXI, but with a slightly different form factor and bus structure.

Because there are many existing PXI and cPCI instrument cards, use of these instrument cards as part of a test system could drastically cut development time as compared to developing the same instrument from scratch for the test system. Also, when the expected production quantity of a given test system module is small, utilizing off-the-shelf instrument cards within the test module can be more economical than developing a new module.

However, because of the specialized and proprietary nature of the hardware and software in conventional test systems, heretofore it has been impossible to plug-in and use the instrument cards from other systems and architectures. ATE systems, for example, generally have a bus specification, board size, and environment that is different from PXI or cPCI. ATE systems generally provide for system calibration and traceability by taking measurements with a traceable instrument (such as a system digital voltmeter (DVM)) that is separate from the system module being calibrated, but is connected to the module by a bus provided by the ATE system. Connections from modules within the ATE system to the DUT are made through an interface that follows certain specifications for all modules and brings the signals from many modules to a loadboard or performance board that allows connection to the DUT. The interface is standardized for a given ATE system so that many types of performance boards for many types of DUTs can be connected to the ATE system. The ATE system has a particular software operating system that allows programming of all the modules in the system.

In addition to these electrical incompatibilities, physical incompatibilities have prevented instrument cards from other systems and architectures to be used in ATE systems. For example, ATE systems are typically designed to accommodate test system modules of a specified size (height, width, depth). These standard test system modules include a printed circuit board (PCB), and there is a size limitation on the components that can be mounted on top of the PCB without exceeding the specified depth (thickness) of the standard test system module. Instrument cards from other systems and architectures are generally too thick to be mounted on top of the PCB.

Because of the incompatibilities between the non-standard instrument cards (i.e. non-standard with respect to conventional ATE) and conventional test systems, previous uses of non-standard instrument cards have not been integrated into the test system and instead have been external to the test system and separately controlled.

Therefore there is a need to provide a carrier for adapting and integrating non-standard instrument cards from other systems and architectures into test systems such as ATE systems.

SUMMARY OF THE INVENTION

The present invention is directed to a carrier module that is able to adapt non-standard instrument cards to the architecture of a test system. This carrier module follows the specifications of the test system, and provides an environment suitable for instrument cards that are non-standard with respect to the test system. One or more instrument cards based on one or more non-standard architectures may be combined on a single carrier module. The carrier module may then be plugged into the test head of the test system.

The carrier module may provide circuitry, contained on a plug-in sub-module called an Application Interface Adapter (AIA), to interface between the instrument cards and the test head interface connector. Different AIAs may be designed and used for different types of instrument cards. Additionally, the AIA may also provide access from the instrument cards to the standard ATE system calibration circuitry, such as the DVM bus. The carrier module may also provide clocks, triggers, power, and data bus to the instrument cards. The carrier module may use the standard data bus of the test system for normal housekeeping functions and some control functions. A second bus may provide the bus for the non-standard instrument cards. Software drivers provided with the instrument cards may be encapsulated with an appropriate wrapper so that the cards run seamlessly in the software environment of the test system.

Because non-standard instrument cards may be too wide to be mounted on one side of a conventional printed circuit board (PCB) designed to fit within a conventional test system module, the carrier module may include a PCB with a cutout area within which the non-standard instrument cards may reside. By locating the non-standard instrument cards within the cutout, the carrier module will not exceed its maximum thickness requirements. Connectors mounted at the edge of this cutout may be used to connect the non-standard instrument cards to circuitry on the carrier module. Two or more levels of non-standard instrument cards may be stacked within the cutout, and non-standard instrument cards or stacks may be placed side-by-side within the cutout. The non-standard instrument cards may also be supported on a PCB without a cutout. Depending on the thickness of the non-standard instrument cards and whether stacks of non-standard instrument cards are being utilized, the carrier module may occupy one or more standard test system module slots.

BRIEF DESCRIPTION OF THE DRAWINGS

FIG. 5 illustrates an exemplary block diagram of a carrier module according to embodiments of the present invention.

FIG. 17 is a perspective view of an exemplary card guide assembly capable of supporting two stacks of two non-standard instrument cards according to embodiments of the present invention.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

Embodiments of the present invention are directed to providing an environment that allows instrument cards that are non-standard with respect to test systems such as an ATE system (e.g. PXI and cPCI instrument cards) to operate within a test head of the test system, and to make the instrument cards appear and function as standard test system modules within the test system.

Figure 1:
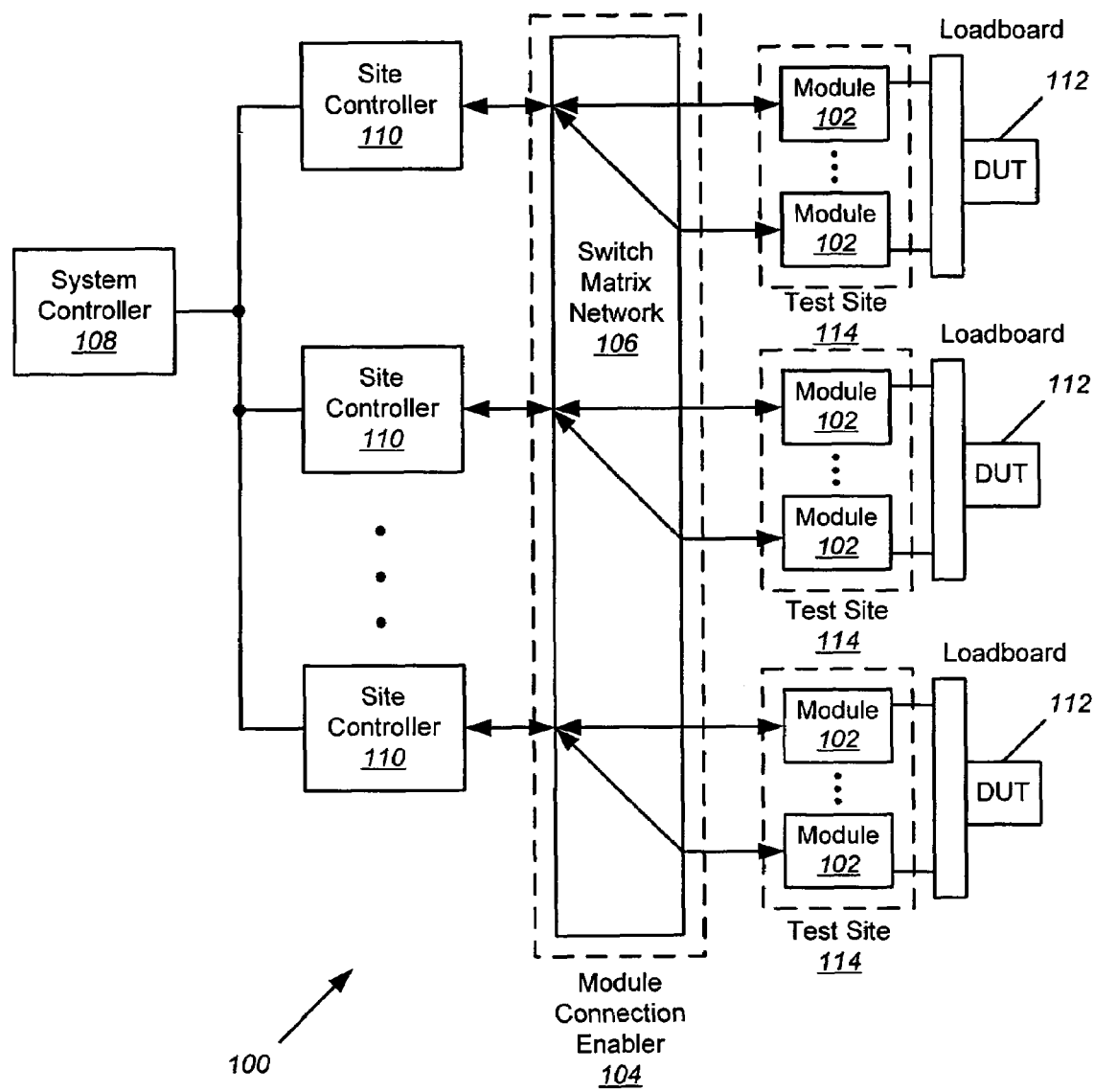
FIG. 1 is an exemplary block diagram of a test system capable of receiving and utilizing carrier modules according to embodiments of the present invention.

Example test system. An exemplary ATE system capable of receiving a carrier module for adapting non-standard instrument cards to the test system is illustrated in FIG. 1. Note that although FIG. 1 illustrates an open architecture test system 100, this test system is presented for purposes of illustration only, and it should be understood that embodiments of the present invention are generally applicable to any type of test system. In FIG. 1, the modules 102 may be functional units such as a digital pincard, an analog card, a device power supply (DPS), or instruments such as a waveform generator. The physical connections to the modules 102 may be obtained through a module connection enabler 104 that includes a switch matrix network 106. The switch matrix network 106 may include logic, traces, and pins. The system controller 108 is typically the point of interaction for a user. The system controller 108 provides a gateway to the site controllers 110 and synchronization of the site controllers 110 in a multi-site/multi-DUT environment. The system controller 108 and multiple site controllers 110 may operate in a master-slave configuration. The system controller 108 controls the overall system operation and determines the functions that a particular site controller 110 should perform. Each site controller 110 is itself sufficient to test one or several DUT's 112. The site controller 110 controls and monitors the operation of various modules 102 within a test site 114. The site and system controllers have their own internal bus, and execute test system software to control the test system.

A test site 114 is a collection of modules 102 that service the testing of a single DUT 112. A site controller 110 can control one or multiple test sites 114. The system controller 108, site controllers 110, module connection enabler 104, and the test sites 114 may communicate with each other using a standard (e.g. proprietary) test system bus.

The overall platform consists of a hardware and software framework that provides interfaces through which various hardware and software modules can be employed. The architecture is a modularized system with module control software and a communication library that allows module-to-module, site controller to module, site controller-to-site controller, and system controller to site controller communication over the proprietary bus.

Figure 2:
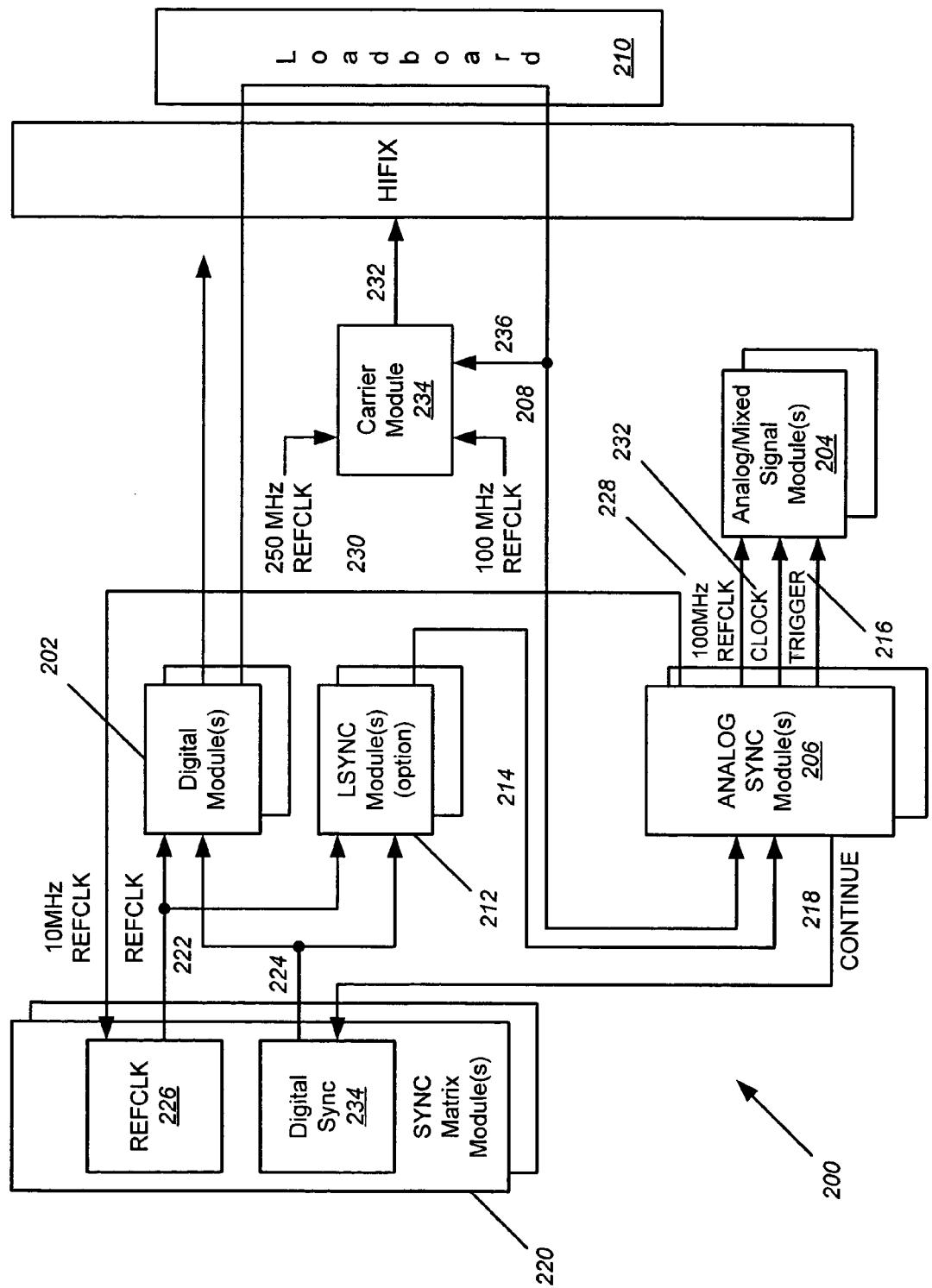
FIG. 2 is an exemplary block diagram of modules that may be utilized within the test site illustrated in FIG. 1.

FIG. 2 is an exemplary block diagram of modules that may be utilized within the test site 114 of FIG. 1. The test site 200 of FIG. 2 may include digital modules 202 and logic synchronization (LSYNC) modules 212. LSYNC modules 212 are essentially digital modules 202 without pin electronics (e.g. driver and comparator). The digital modules 202 and LSYNC modules 212 operate under pattern control (i.e. they operate in accordance with patterns stored within their memories) to generate a sequence of output signals or triggers on their pins.

The digital modules 202 and LSYNC modules 212 may be started based on patterns stored in their memory. The patterns determine whether the outputs of the digital modules 202 or LSYNC modules 212 are to be high or low, or what to expect on their inputs, at very specific times (e.g. 100 picosecond accuracy). Pattern management software is also stored in memory.

Synchronization of the patterns stored in memory in the digital modules 202 and LSYNC modules 212 may be achieved through one or more sync matrix modules 220. The digital sync block 234 within a sync matrix module 220 is a control source for pattern generators in the digital modules 202 and LSYNC modules 212. The patterns in the digital and LSYNC modules can be started, stopped, continued and otherwise controlled in unison with high accuracy by utilizing the same reference clock 222 and control signals 224 coming from the digital sync block 234.

The test site 200 may also include analog/mixed-signal modules 204. The analog/mixed signal modules 204 may contain triggerable devices such as AWGs (which could in turn modulate a radio frequency (RF) source) and DGTs. It may be desirable for the AWGs or DGTs to be triggered a specified time after the digital modules 202 have sent certain output signals to the DUT so that the DUT is configured in a particular fashion prior to receiving the output of the AWG or an RF source.

For example, an AWG in an analog/mixed signal module 204 can be started by a trigger 208 from a digital module 202, and the AWG may run until the signal has stabilized at the DUT. The digital module 202 may then trigger multiple digitizers, and trigger the AWG to go to the next step and generate the next waveform, and the cycle can be repeated. The digitizers or the AWG can also send a trigger signal 216 back to the digital module 202 instructing it to continue the digital pattern and perform other digital tests.

An ASYNC module 206 may be used to assist in synchronizing the digital and analog modules. The digital modules 202 or LSYNC modules 212 can be programmed such that in the middle of a pattern, a pulse or some output can be transmitted to the ASYNC module 206. For example, the ASYNC module 206 may receive an event trigger 214 from an LSYNC module 212. Alternatively, a digital module 202 may also send a performance board (PB) trigger 214 to the ASYNC module 206 that may be first routed to a PB (loadboard) 210 and then to the ASYNC module 206. (Note that the loadboard 210 is a board upon which the DUT is mounted, and serves to connect the DUT to the test site.)

PB triggers 208 may be utilized in lower-cost, less-flexible test sites that do not include an LSYNC module 212. PB triggers 208 are first routed to the loadboard 210 because all other outputs from the digital modules 202 are also routed to the loadboard 210. If the test site 200 includes an LSYNC module 212, then the PB triggers 208 may not be utilized. Multiple PB triggers 208 (e.g. four) may be generated from each digital module 202 and connected to the ASYNC module 206 through the loadboard 210. Multiple event triggers 214 (e.g. four) may also be generated from each LSYNC module 212 and connected directly into the ASYNC module 206. If both PB triggers 208 and event triggers 214 are present in a test site, then either or both may be used.

The ASYNC module 206 may be programmable by the site controller (see reference 110 in FIG. 1) to route these triggers to one or more (e.g. 16) analog/mixed signal modules 204 on trigger lines 216. The analog/mixed signal modules 204 may in turn send trigger signals 216 back to the ASYNC module 206, which would then access digital control lines called "continue" lines 218. The continue signals 218 are sent to the digital sync block 234 in the sync matrix module 220, which would then control the starting, stopping, or continuation of pattern generation in the digital modules 202 and LSYNC modules 212 via control signals 224.

The ASYNC module 206 may also be programmable by the site controller to route one or more clock sources to one or more (e.g. 16) analog/mixed signal modules 204 on clock lines 232. By centrally distributing clocks 232 in parallel from the ASYNC module 206 to the analog/mixed signal modules 204, if one analog/mixed signal module 204 has a problem, which is more likely in open architecture test systems due to modules being designed and manufactured by different companies, it should not prevent the other analog/mixed signal modules 204 from operating.

To synchronize all the analog/mixed signal modules 204, LSYNC modules 212 and digital modules 202, there must be a single reference source for all generated system clocks. If the test site 200 only contains digital modules 202 and LSYNC modules 212, the reference source can be an internally generated REFCLK 222 from the sync matrix module 220. The sync matrix module 220 may include a reference clock source 226 such as, for example, a 250 MHz reference clock source for generating REFCLK 222.

However, if the test site 200 includes analog/mixed signal modules 204, these modules may require a higher purity, lower jitter reference clock source than the digital modules 202 or LSYNC modules 212. The ASYNC module 206 may provide a higher purity, lower jitter reference clock 228 such as, for example, a 100 MHz reference clock. In order to synchronize the digital modules 202 and LSYNC modules 212 to this higher purity, lower jitter reference clock 228, the reference clock 228 is divided down to lower frequency reference clock 230. In the example of FIG. 2, the 100 MHz reference clock 228 may be divided by ten to 10 MHz (see lower frequency reference clock 230) and sent to the sync matrix module 220 to act as a reference to which the 250 MHz reference clock source 226 may lock using a phaselocked loop (PLL) so that the reference clock 228 from the ASYNC module 206 becomes the reference source for the entire test site. Note, however, that if the test site contains no analog/mixed signal modules 204 or modules that require a higher purity, lower jitter reference clock source, then there may be no higher purity, lower jitter reference clock 228 or lower frequency reference clock 230 generated within the test site. In such an instance, the reference clock source 226 in the sync matrix module 220 may generate REFCLK 222 from a crystal oscillator.

Overview of present invention. As described above, test systems may communicate via a standard test system bus (e.g. a proprietary bus). However, there are many instrument cards available in the market that use interfaces that are non-standard with respect to the proprietary bus of the test system and operate in accordance with a system bus that is different from the standard test system bus. Because non-standard instrument cards are readily available and perform functions such as an AWG or DGT that are needed by the test system, a carrier module according to embodiments of the present invention allows a non-standard instrument card to be adapted to the specifications, bus and architecture of the test system.

Figure 4:
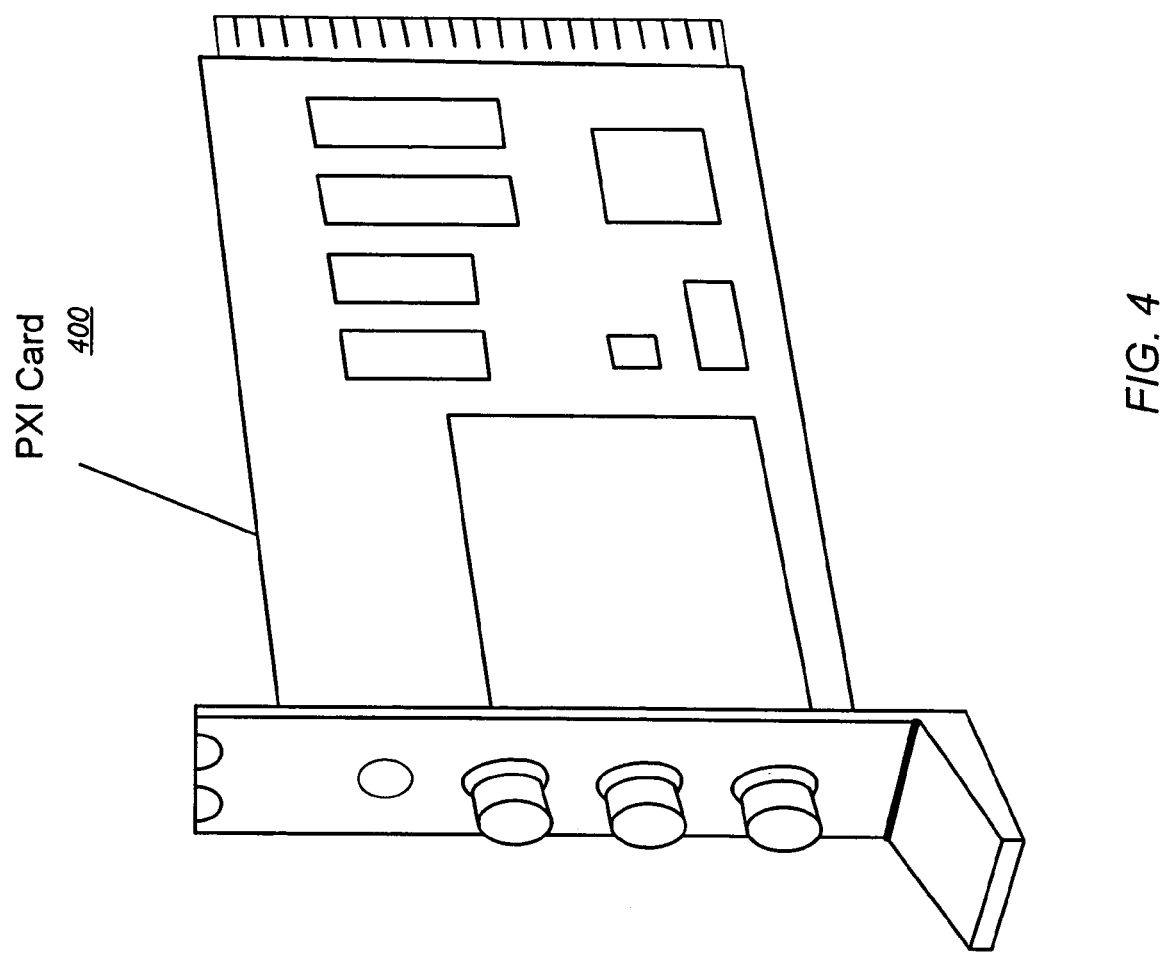
FIG. 4 illustrates a conventional PXI instrument card as one example of an instrument card that may be utilized within the carrier module according to embodiments of the present invention.

As mentioned above, one example of a non-standard instrument card is the PXI instrument card 400 illustrated in FIG. 4. It should be understood that although PXI cards are described herein for purposes of illustration and explanation only, embodiments of the present invention are generally applicable to any instrument cards that are non-standard with respect to the test system, such as cPCI instrument cards, VME instrument cards, other test head cards, and the like.

Referring again to FIG. 2, a carrier module 234 according to embodiments of the present invention is plugged into a module slot in the test head at the test site 200, just like any other module. This carrier module 234 follows the specifications of the test system, and acts like an adapter or bridge to allow one or more instrument cards with architectures that are non-standard with respect to the test system to operate within the test system. The carrier module 234 may provide circuitry, contained on a plug-in sub-module called an Application Interface Adapter (AIA), to interface between the instrument cards and the test head interface connector. Different AIAs may be designed and used for different types of instrument cards. Additionally, the AIA may also provide access from the instrument cards to the standard ATE system calibration circuitry, such as the DVM bus. The carrier module 234 may also provide clocks, triggers, power, and data bus to the instrument cards. The carrier module 234 may use the standard data bus of the test system for normal housekeeping functions and some control functions. A second bus may provide the bus for the non-standard instrument cards. Software drivers provided with the instrument cards may be encapsulated with an appropriate wrapper so that the instrument cards run seamlessly in the software environment of the test system, and actually appear to be an integrated part of the test system.

FIG. 5 illustrates an exemplary block diagram of a carrier module 500 according to embodiments of the present invention. Note that the dimensions of the carrier module 500 may be identical to a standard module for compatibility with and use in the test system. The carrier module 500 has a board top connector 510 that may be identical to the connector used by other digital modules in the test system, and may include coaxial connectors that connect to the performance board (loadboard). In the example of FIG. 5, two instrument cards 502 are plugged into an instrument card backplane 504. However, in alternative embodiments of the present invention, depending on the size of the non-standard instrument cards, more than two instrument cards may be plugged into the backplane in a side-by-side arrangement. Note that the instrument cards 502 have BNC or SMA connectors 506 to bring signals in and out.

In some instances, the non-standard instrument cards 502 may be wide enough so that if the instrument cards 502 were mounted on top of the carrier module 500, the total thickness of the populated carrier module would exceed the standard height of a module in the test system. In such circumstances, a cutout 530 may be provided in the carrier module 500. The instrument card backplane 504 can then be mounted within the cutout 530 so that the instrument cards, when installed, protrude on both sides of the carrier module 500 and yet do not cause the total carrier module thickness to exceed the standard height of a module in the test system. However, in alternative embodiments, the non-standard instrument cards may be supported on a carrier module without a cutout.

Note also that the size of the instrument cards determines the number of instrument cards that can be placed in one carrier module. For example, PXI cards come in a 3U size (5.75"). cPCI cards (which fit into cPCI backplanes) use connectors and a bus scheme that is compatible with PXI. However, because cPCI cards are larger that PXI instrument cards, only one cPCI card may be insertable into the carrier module. In alternative embodiments, the carrier module may contain a single level of instrument cards, or one or more stacks of two or more instrument cards that would cause the carrier module to take up the width of two or more test system modules.

AIA sub-module. The AIA 508 is a submodule or daughter board that plugs into the carrier module 500 and provides a customized interface from the instrument cards to the board top connector 602 so that the carrier module can be connected to the test head using the same connector as all other digital modules in the system. Other connectors may be used for RF or higher bandwidth signals.

Figure 5A:
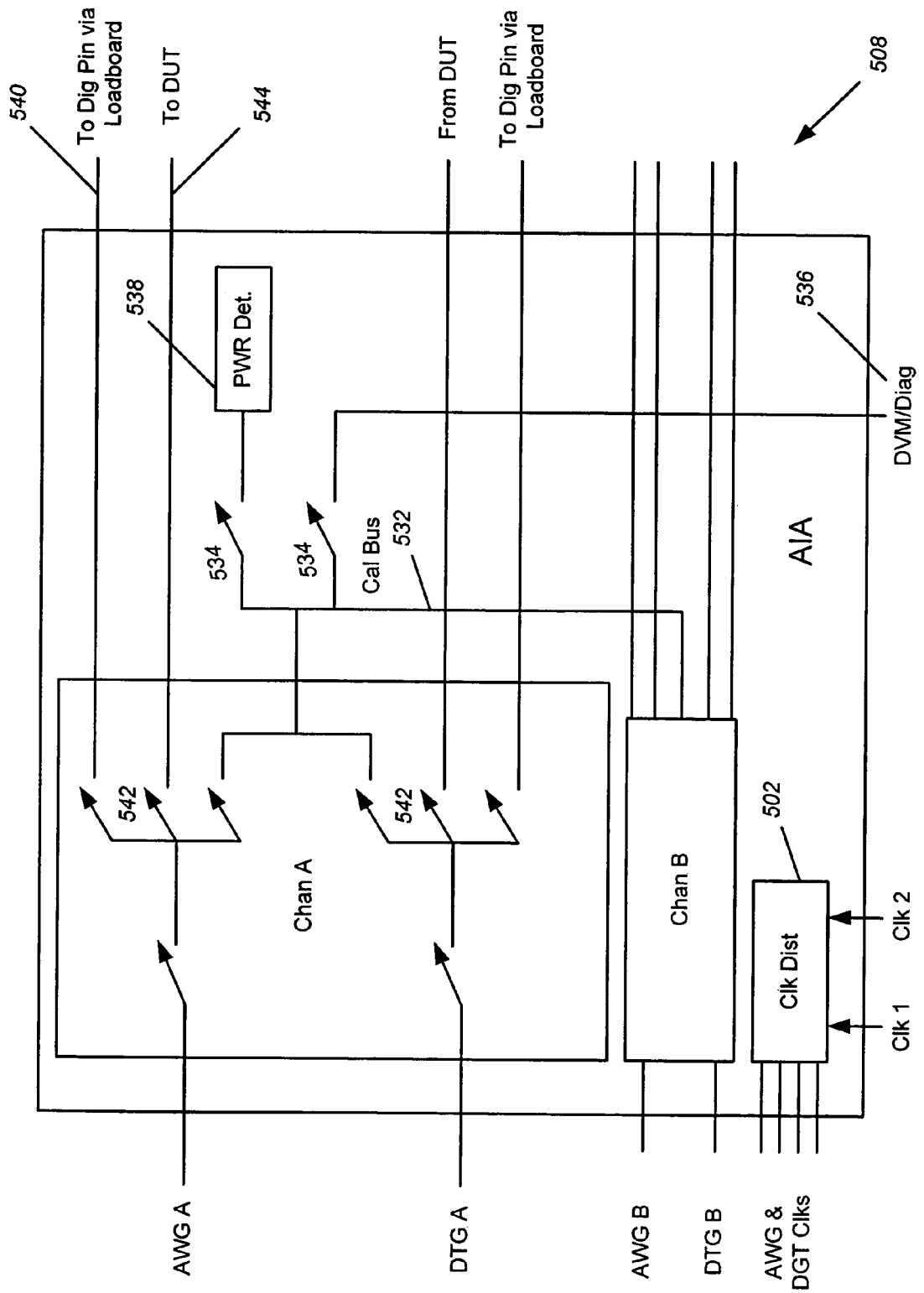
FIG. 5a illustrates an exemplary simplified AIA according to embodiments of the present invention.

FIG. 5a illustrates an exemplary simplified AIA 508 according to embodiments of the present invention. In the example of FIG. 5a, an AWG instrument card and a DGT instrument card are installed in the carrier module, and each instrument card has two channels, A and B.

Calibration using AIA sub-module. As mentioned above, non-standard instrument cards and enclosures generally do not perform system calibration to a common calibration standard. However, as described above, the AIA allows the carrier module to connect to the BNCs and SMAs so that calibration of the instrument cards can be performed in a manner similar to how other modules in the test system are calibrated. The AIA according to embodiments of the present invention provides a calibration bus 532, and is capable of controlling calibration switches 534 to switch the signals to the system DVM 536 via the calibration bus and calibrate the instrument cards. For example, an output of one of the instrument cards can be connected to the power detector 538 to detect frequency flatness and the like, or an AWG output can be connected to a DGT channel in a loopback fashion to verify the operation of the AWG.

Connectivity test using AIA sub-module. When a DUT is first installed into a test head, a common first test is a connectivity test, which is performed to make sure that the connections between the test head and the DUT are present and working correctly, and that there are no bond wires broken inside the DUT. To perform this connectivity test, a current is applied to the pins to forward bias the protection diodes. The tester then measures forward voltage to determine if each pin is connected. In embodiments of the present invention, a set of channel routing switches or relays 542 are provided on the AIA 508 to allow a digital pin from a digital module to be brought into the AIA via the loadboard (see reference 236 in FIG. 2) and then back out to a pin on the DUT (see reference 238 in FIG. 2). Digital pin connections 540 and DUT connections 544 may be provided on the AIA 508 to facilitate this connection. The purpose of this connection is so that the connectivity test can be performed quickly. Once the test is complete, the relays or switches 542 would be reconfigured to connect up an AWG, for example, to the pin on the DUT. In alternative embodiments of the present invention, the actual circuitry that makes this connectivity test forward current measurement can be placed on the AIA 508.

Clk Dist block on AIA sub-module. Referring again to FIG. 5*a*, in embodiments of the present invention the Clk Dist block 502 may receive Clk 1 and Clk 2 and send them to the appropriate connectors on the front of the instrument cards that need those clocks.

Alternative embodiments of AIA sub-module. In alternative embodiments of the AIA (not shown), differential inputs and outputs (I/O) may be provided. In such embodiments, the AIA may contain amplifiers that provide the differential I/O and change the gain ranges. In other alternative embodiments, a single AWG output could be split in into several signals, so that an AWG output could be sent to four different DUTs. Alternatively, a selector switch could select one signal from among three or four DUTs and send it to a DGT. In addition, an AIA may contain circuits and processors for performing DSP on an analog signal before sending it off to an instrument card.

In further alternative embodiments, a device power supply instrument card could be installed in the carrier module along with a different AIA. The AIA could contain current monitoring or means of switching in different calibration circuitry. This illustrates that different AIAs may be designed depending on the application and the instrument card employed.

In still further alternative embodiments, an AIA may be employed in a carrier module without any instrument cards to perform loop-back testing of high speed serial interfaces. The AIA could be configured using appropriate switches, cables and the like to enable a loopback connection of a 2.5 Gb or 3.125 Gb serial interface, for example, or to send the signal somewhere else for further testing, without installing an instrument card.

In general, therefore, AIAs may be configured as interface circuitry for instrument cards, or configured with functional testing circuitry without needing an instrument card.

Standard and secondary data buses. Referring again to FIG. 5, embodiments of the present invention may employ two or more data buses on the carrier module 500. One of these data buses is the standard test system bus of the tester, which is connected to the carrier module at connector 520. Most or all of the housekeeping functions on the carrier module 500 may be performed via this standard test system bus, in a manner similar to any other module in the test system. Most or all of the control functions on the carrier module 500, such as the control of relays or switches on the AIA 508 or control signals that are fed into the Clk/Trig block 514 may also be performed over the standard test system bus.

Figure 3:
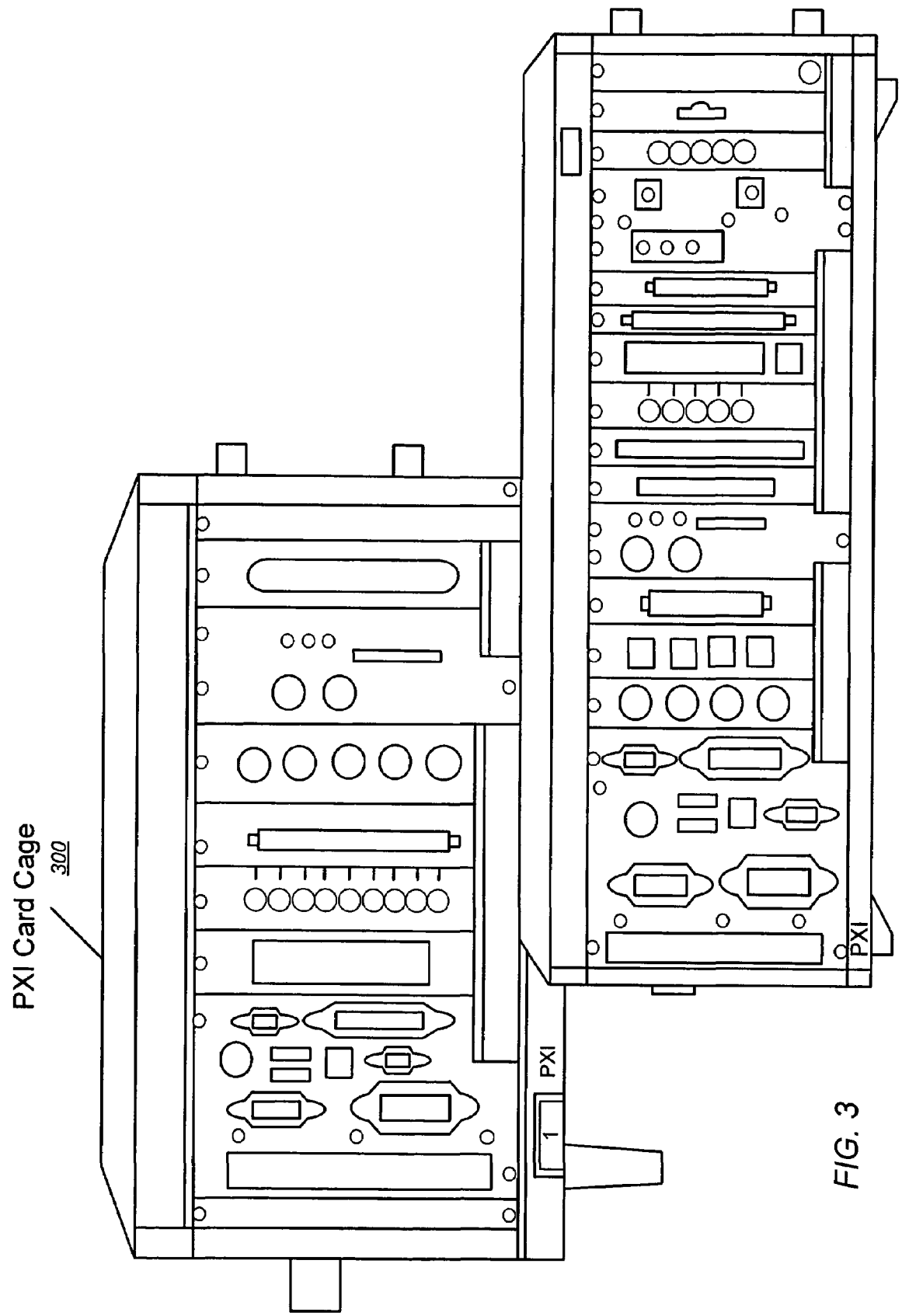
FIG. 3 illustrates a conventional PXI card cage for receiving PXI instrument cards.

As described above, the other bus that may exist on the carrier module is the system bus of the instrument cards, which connects the instrument cards via the backplane 504. For example, a PXI instrument card 502 utilizes a cPCI bus, which is a ruggedized form of the PCI bus. However, because PXI is PCI with extensions, PXI instrument cards use a cPCI bus with some additional signals for triggering and clock. In conventional PXI enclosures of the type illustrated in FIG. 3, a processor that controls the PXI instrument cards is itself located on a PXI card in one of the PXI card slots (e.g. slot 0).

In embodiments of the present invention, this processor is replaced by the processor in either the site or system controller. Referring again to FIG. 5, to accomplish this, a bridge 522 is employed on the carrier module 500 to connect the processor in the site or system controller to the instrument cards 502. The bridge 522 is necessary because normal system buses can only be 8-10 inches long due to a lack of terminated transmission lines. Bridges were developed to allow devices to operate at great distances. Once this bridge 522 is in place, the instrument cards 502 that are plugged into the instrument card backplane 504 on the carrier module 500, from a software driver point of view, appear to be plugged into a backplane in the site or system controller computer.

The low-level driver software and configuration files for each instrument card that was intended to be executed by the processor in the non-standard instrument card enclosure is now loaded into the site or system controller of the test system, which allows the test system to control the non-standard instrument cards. This enables the test system to use the OEM low-level driver software that configures the instrument cards to set registers and relays, load memories and the like. It is also the hardware driver for the card. In alternative embodiments of this invention, the processor that controls the non-standard instrument cards could be retained on the module itself.

Figure 6:
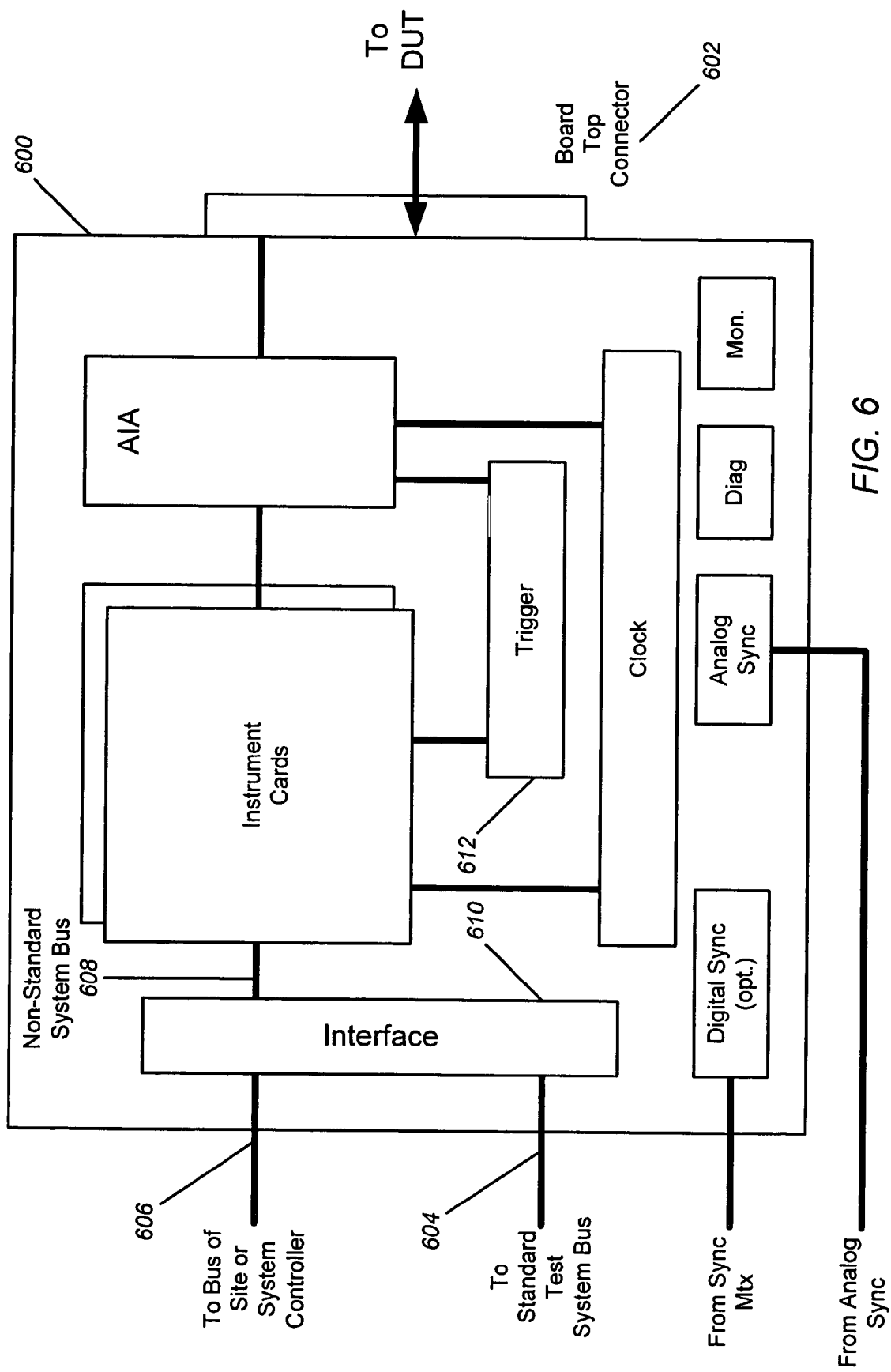
FIG. 6 illustrates another exemplary block diagram of a carrier module according to embodiments of the present invention.

FIG. 6 is similar to FIG. 5, and illustrates the connections from the carrier module 600 to the DUT through board top connector 602, the connections from the carrier module 600 to the site or system controller and other modules through the standard test system bus 604, and the connections from the carrier module 600 to the site or system controller through the non-standard system bus 608 and an interface 610 that serves as a bridge between the bus in the site or system controller and the non-standard system bus.

Figure 7:
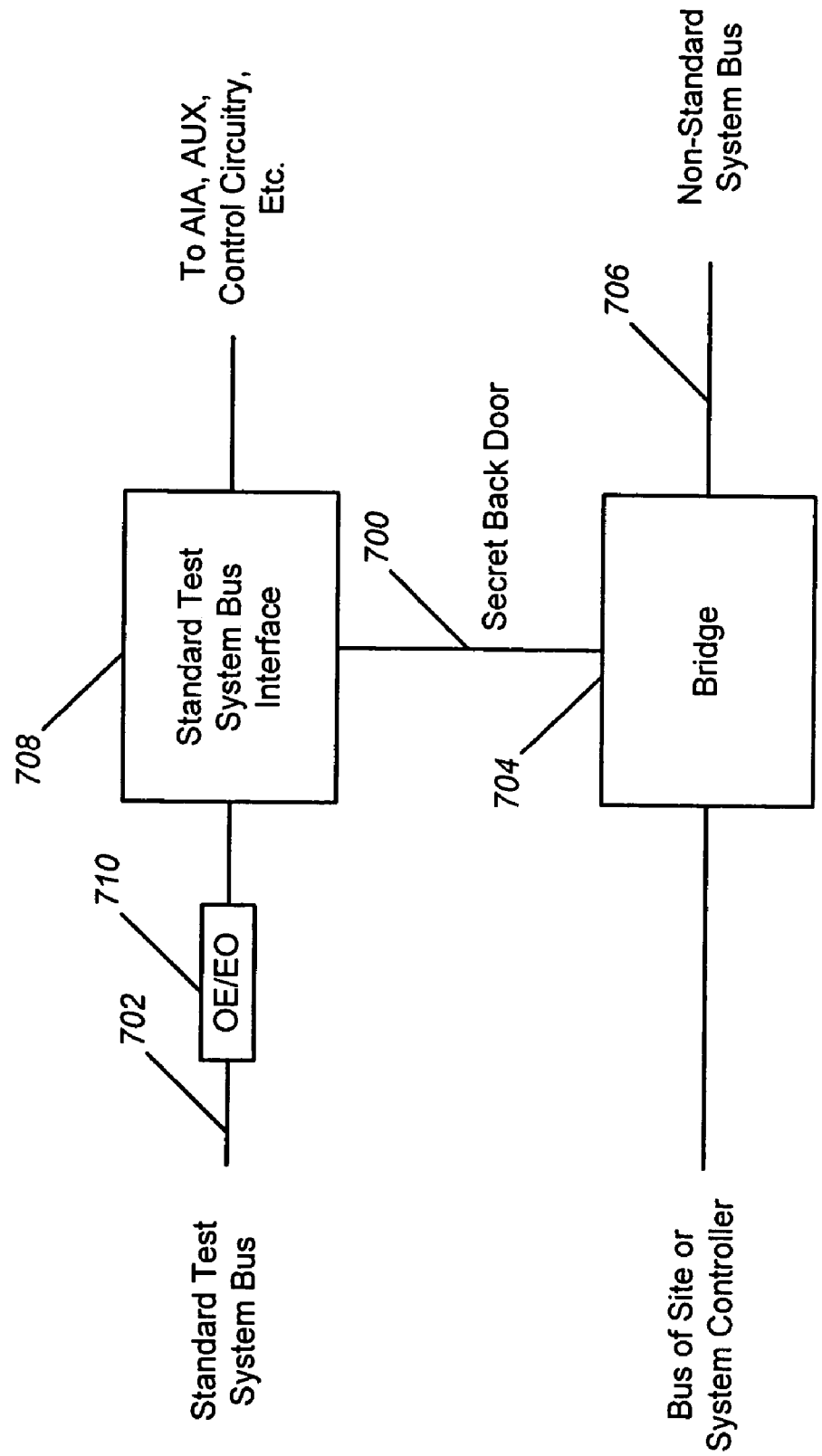
FIG. 7 illustrates a secret back door provided according to embodiments of the present invention.

Back door between data buses. FIG. 7 illustrates a secret back door bus 700 provided according to embodiments of the present invention. The FPGAs resident on test system modules that control how the modules work may be difficult to re-program, should that become necessary. To reprogram an FPGA, it might have been necessary to take the module apart and install a connector for the purpose of reprogramming. To avoid this, in embodiments of the present invention a connector is provided on the carrier modules to provide access to the FPGA, and in addition, a secret back door bus 700 to the standard test system bus 702 is provided using the bridge 704 to the secondary data bus (non-standard system bus) 706. A standard test system bus interface 708 enables reprogramming of the FPGA via the bridge 704 and the secret backdoor bus 700. The OE/EO block 710 is the optical to electrical (and vice versa) converter (a commercial off-the-shelf part), which is needed when the standard test system bus is an optical bus.

Additional software layer. As described above, the non-standard instrument cards come with low-level driver software. This driver software is able to communicate with the instrument card, and enables the instrument card to run in its instrument card enclosure in conjunction with other higher-level software. For example, in the PXI environment National Instruments provides software called LabView™ and TestStand™ which are top-level controlling software that controls a National Instruments test box comprised of PXI instrument cards.

However, in embodiments of the present invention the goal is to have the low-level driver software operate in conjunction with the test system software. Therefore, in embodiments of the present invention, another layer of software is written around the OEM driver software. This new layer of interface software takes the outputs (commands) of the test system software within the site or system controller and translates them into the appropriate commands for the OEM driver software. This new layer of software takes commands from the test system software and knows which ones to send out over the secondary bus (e.g. a PCI bridge) and which ones to send over the standard data bus.

This new layer of software enables the non-standard instrument cards to run in the test system framework and use the tools available in the operating system framework. For example, the carrier module can run the test system's configuration software. This new layer of software makes the carrier module look like a standard tester module. In fact, users need not know that there are non-standard instrument cards in the tester. For example, a PXI arbitrary waveform generator (AWG) or digitizer (DGT) instrument card can be plugged into the carrier module, and the carrier module can be advertised and sold as an AWG or DGT without reference to PXI.

Because each non-standard instrument card may require a unique layer of software, specific instrument cards could be chosen and the interface software written for those cards, so users can have a choice of selected cards with interface software already written.

Figure 7A:
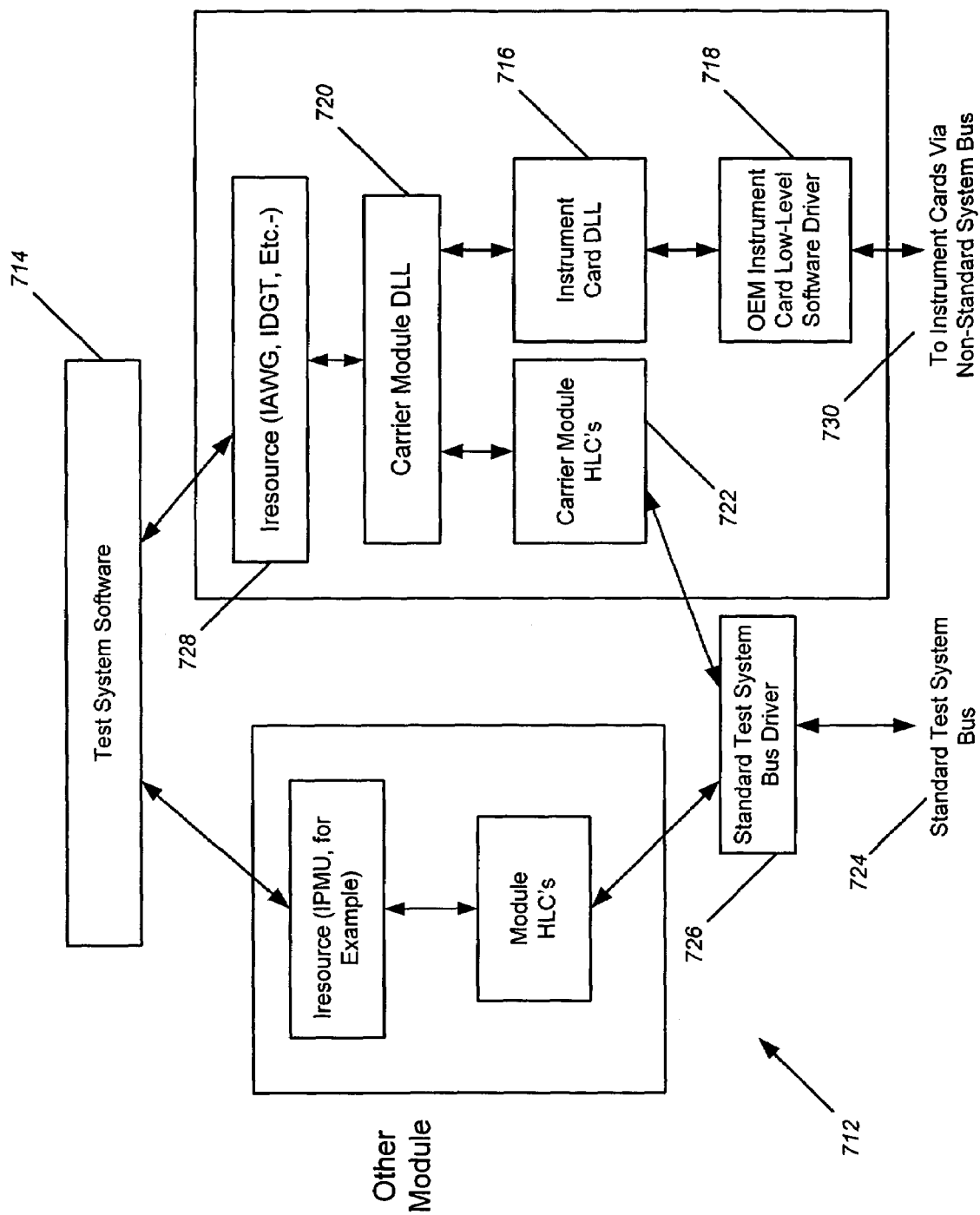
FIG. 7a illustrates an exemplary block diagram of the test system software model according to embodiments of the present invention.

FIG. 7a illustrates an exemplary block diagram of the test system software model (the software layers) 712 according to embodiments of the present invention. Starting at the top level, the test system software 714 running on the site or system controllers appears to the user to be a computer application. From the test system perspective, when hardware modules containing non-standard instrument cards are plugged into the test head, the goal is to have them appear to be just another module in the test system. Conversely, from the instrument card perspective, when hardware modules containing non-standard instrument cards are plugged into the test head, the goal is to have the test system appear to be the backplane of the instrument card.

To accomplish this, a new layer of software in required. When the instrument card dynamic linked library (DLL) 716 and OEM instrument card low-level driver software 718 provided with the instrument card is encapsulated with this new layer of software (the carrier module DLL 720), the instrument card appears to the test system to be a normal test system module. At the same time, from the instrument card's perspective, the new layer of software emulates the software environment of the instrument card and makes the test system appear to be a normal instrument card backplane. In other words, embodiments of the present invention create a software environment that goes around the instrument card driver and provides an interface that matches up with what the system test software expects to see, so that it appears to the end user to be a standard test system module when in fact, underneath the module is using software written for a non-standard instrument card. By doing so, the burden of understanding the instrument card software and writing software to directly interface with the instrument card is avoided.

This new layer of software encapsulates the low-level software driver 718, calls routines within the low-level driver software 718, and also calls routines within the carrier module high level commands (HLCs) 722, which is also part of the new layer of software. The carrier module HLCs 722 translate high-level commands to low level commands to be communicated over the standard test system bus 724 via a standard test system bus driver 726. Another interface layer of software labeled Iresource 728 in FIG. 7a enables the modules to communicate with the test system software. This interface layer of software stays the same for a given type of hardware module, regardless of what instrument card low-level driver software and corresponding new layer of software is resident in the module. This consistent interface layer allows test programs to be developed using the same interface regardless of what modules are plugged in.

The new wrapper or encapsulating layer of software 720 determines which software to call (either the carrier module HLC's 722 or the instrument card DLL 716) depending on which data bus it needs to talk to (e.g. either the standard test system bus 724 or the non-standard system bus 730), and determines how to translate the commands.

Clk/Trig block. Referring again to FIG. 5, the Clk/Trig block 514 receives synchronization signals from the test system via a Sync connector 516 and an Analog Sync connector 518. In addition, the Clk/Trig block 514 receives and distributes clocks needed within the instrument cards 502 and the carrier module 500. For example, if an instrument card 502 requires a 10 MHz clock on its backplane, the Clk/Trig block 514 will generate and provide this 10 MHz clock based on other clocks received in the Clk/Trig block 514. Furthermore, if the instrument cards 502 send or receive triggers through their front connectors 506, these triggers may be routed between the Clk/Trig block 514 and the instrument cards 502 through the AIA board. In addition, if the instrument cards 502 accept additional clock inputs on their front BNC or SMA connectors 506, the appropriate clock signals may be routed from the Clk/Trig block 514 to the AIA 508, where short coaxial cables may be employed to connect these clock signals to the instrument cards through their front connectors.

Figure 8:
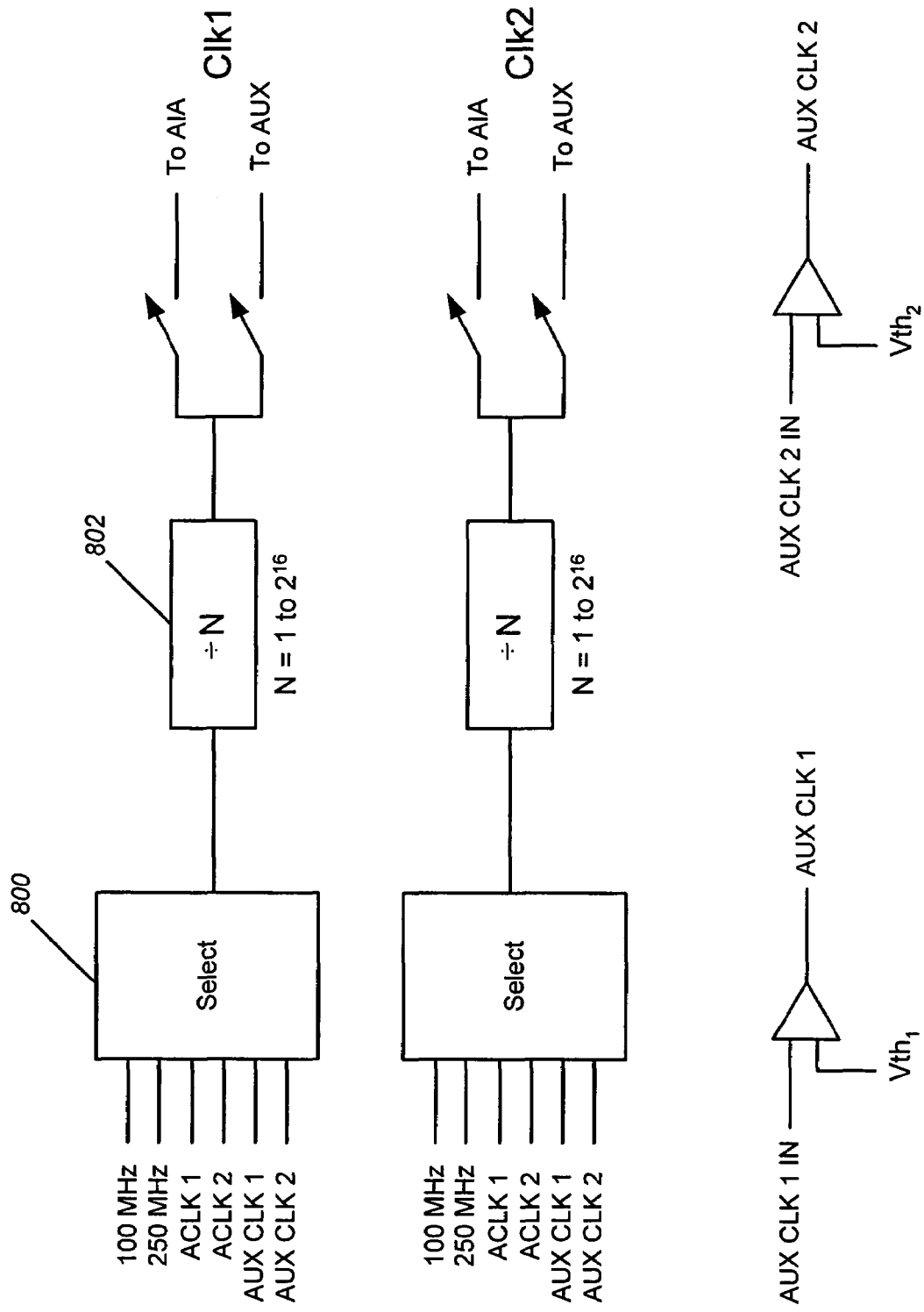
FIG. 8 illustrates an exemplary clock distribution scheme according to embodiments of the present invention.

FIG. 8 illustrates an exemplary clock distribution scheme according to embodiments of the present invention. The various clock signals that are available at the test head, such as those available on the SYNC and ASYNC connectors, may be selected and divided down in a programmable fashion via selector 800 and divider 802 so that they can be sent to the AIA (for delivery to the front connector of an instrument card) or an AUX block (see reference 544 in FIG. 5). AUX clock inputs that can be wired through the AIA to the top connectors that go to the test head may also be provided so that clocks can be sent to the performance board on the test head. In alternative embodiments of the clock distribution, a more complex clock synthesizer providing more choices of clock frequencies may be used. In other alternative embodiments, this clock synthesizer may be located on the AUX plug-in daughter card 544.

Figure 9:
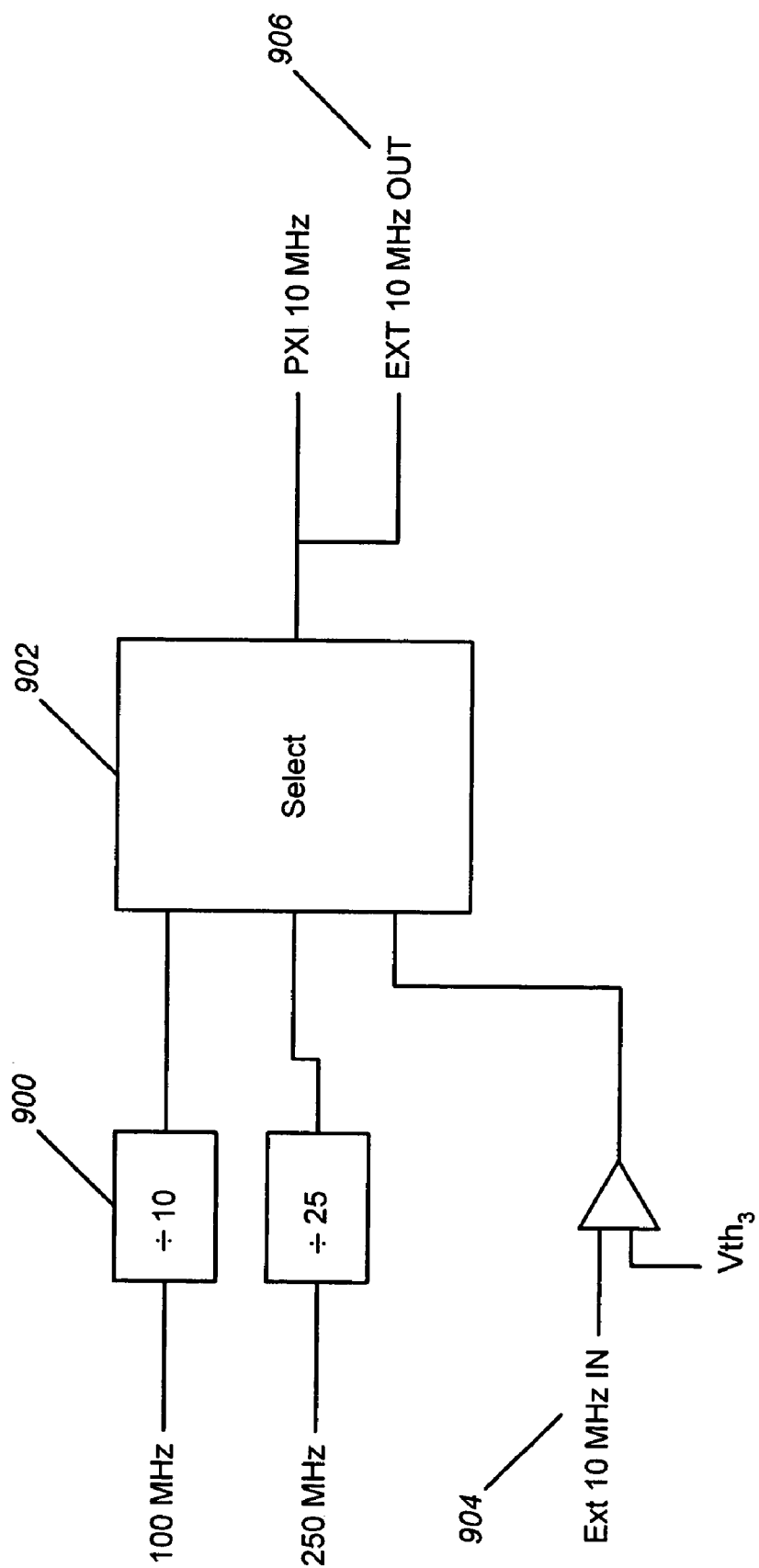
FIG. 9 illustrates an exemplary generation of a 10 MHz clock according to embodiments of the present invention.

FIG. 9 illustrates an exemplary generation of a 10 MHz clock according to embodiments of the present invention. In some instances, the instrument card may require a 10 MHz clock. The carrier module must provide this 10 MHz clock in a manner that allows the instrument card to synchronize with the test system. This is especially important if AWG or DGT instrument cards are to be inserted into the carrier module. To do this, the 10 MHz clock must be generated from a clock that is already synchronized within the system. As described above with respect to FIG. 2, in the test system a 250 MHz REFCLK 222 is generated by the Sync matrix module 220 and distributed to those modules that have a sync connector. In addition, because the use of analog instruments is envisioned within the carrier module, the analog sync connector on the carrier module provides a 100 MHz signal. Either clock can be divided down to 10 MHz via dividers 900, and one of the two clocks can be selected under program control via selector 902 for use within the instrument card. In alternative embodiments, an external 10 MHz clock 904 may be received, and an external 10 MHz clock 906 may be provided.

Figure 10:
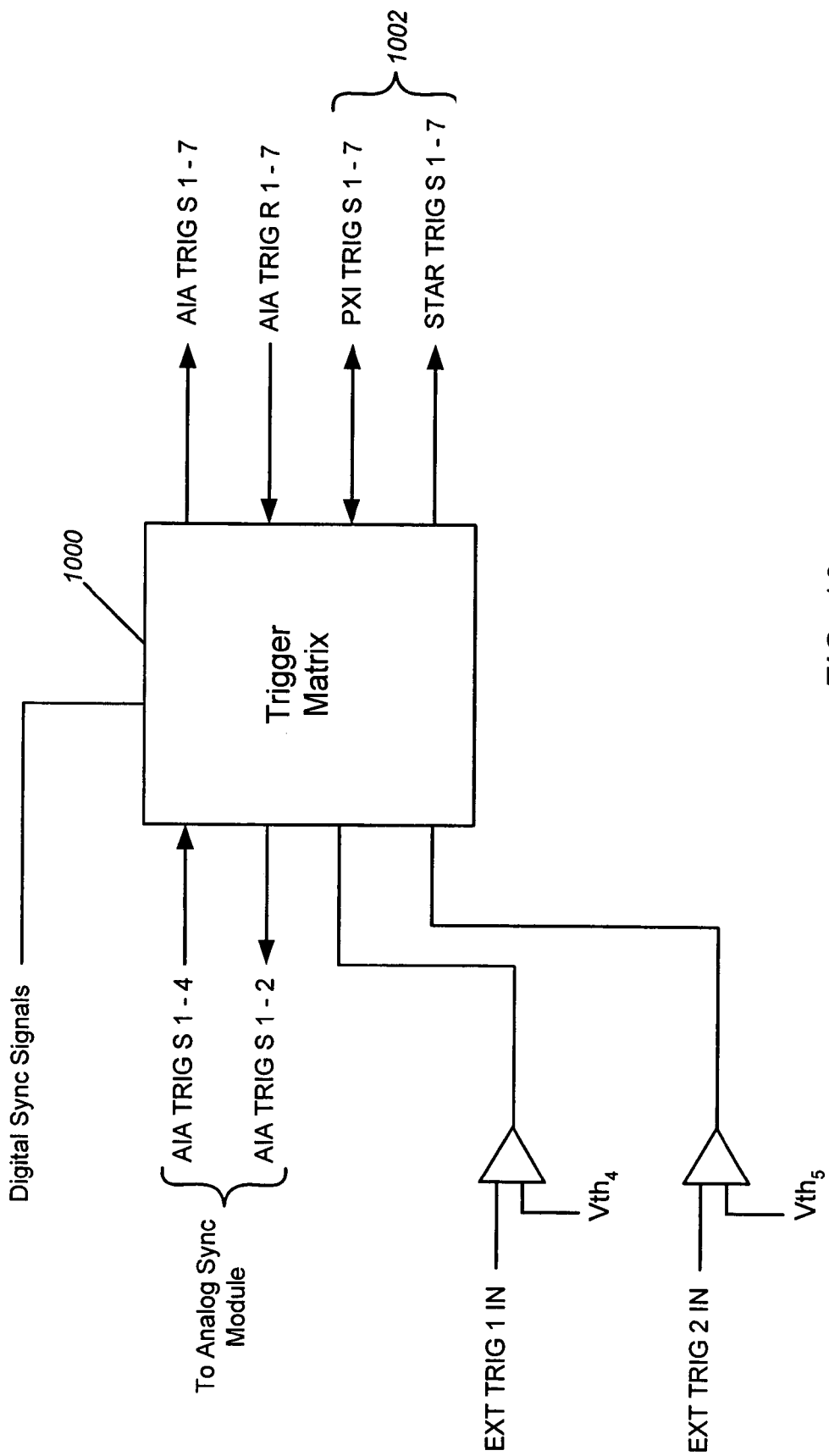
FIG. 10 illustrates an exemplary distribution of triggers according to embodiments of the present invention.

FPGA block. Referring again to FIG. 5, the FPGA block 524 contains most of the logic for the carrier module 500, and includes a trigger matrix (see trigger block 612 in FIG. 6). FIG. 10 illustrates an exemplary trigger matrix 1000 for the distribution of triggers according to embodiments of the present invention. The analog sync module 206 (see FIG. 2) provides four trigger sends and receives two trigger returns. Thus, if an analog sync connector is plugged into the carrier module, the carrier module will receive the four trigger sends from the analog sync module, and could send two trigger returns back to the analog sync module.

The trigger matrix 1000 provides an interface for the triggers between the non-standard instrument cards and test system. In the example of FIG. 10, PXI instrument cards are inserted into the carrier module, and the PXI instrument cards may require PXI and Star triggers 1002. The trigger matrix 1000 receives either triggers from the analog sync module, or from an external source, or from another PXI module, or from the digital sync matrix, and distributes the required triggers to the instrument cards. There are also some triggers that go to the AIA for instrument cards that receive triggers into their front connectors or generate triggers at their front connectors. In addition, if the carrier module needs to receive a trigger from a digital pin through the performance board, this trigger could be received into the carrier module through the AIA, which would then route the trigger to the trigger matrix and then to the instrument cards, or to the analog trigger return and back to the analog sync module.

Figure 11:
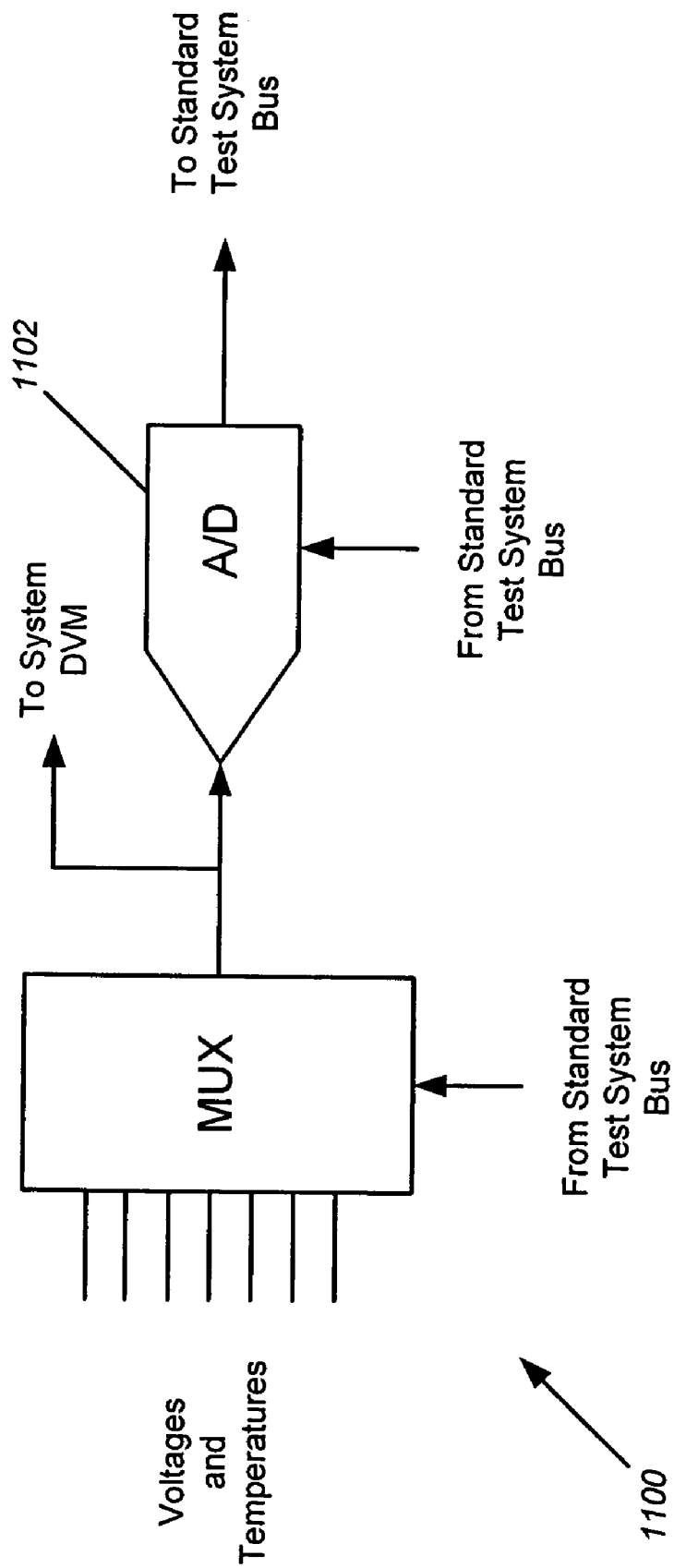
FIG. 11 is an exemplary diagram of a diagnostic circuit according to embodiments of the present invention.

Diag block. Referring again to FIG. 5, the Diag block 526 contains diagnostic circuitry for self-test on the carrier module 500 as a system. FIG. 11 is an exemplary diagram of a diagnostic circuit 1100 according to embodiments of the present invention. The diagnostic circuitry of FIG. 11 provides an indication of whether the carrier module is working as expected in the test system. By properly designing the AIA, which can be modified or swapped out for other AIA sub-modules depending on what instrument cards are being used in the carrier module, voltages and temperatures from the instrument cards and carrier module can be monitored. The diagnostic circuit may perform the monitoring function utilizing an A/D 1102 in the carrier module which is controlled by the standard test system bus, or by connecting to a system DVM that is used for calibration and is traceable back to the National Institute of Standards and Technology (NIST). In this manner, all modules in the test system can be calibrated to the system DVM, and then only the system DVM needs to be pulled out and calibrated at established calibration intervals. By calibrating non-standard instrument cards that are not normally calibrated, the instrument cards are much more useful in ATE applications.

Sys Mon block. Referring again to FIG. 5, the carrier module also contains a Sys Mon block 528, or board monitor. The Sys Mon block 528 is a system monitor that measures critical voltages and parameters on the carrier module 500 on a real-time basis, isolated from other diagnostics or from the operation of the instrument card so that a real-time monitor of the health of the carrier module can be implemented.

Figure 12:
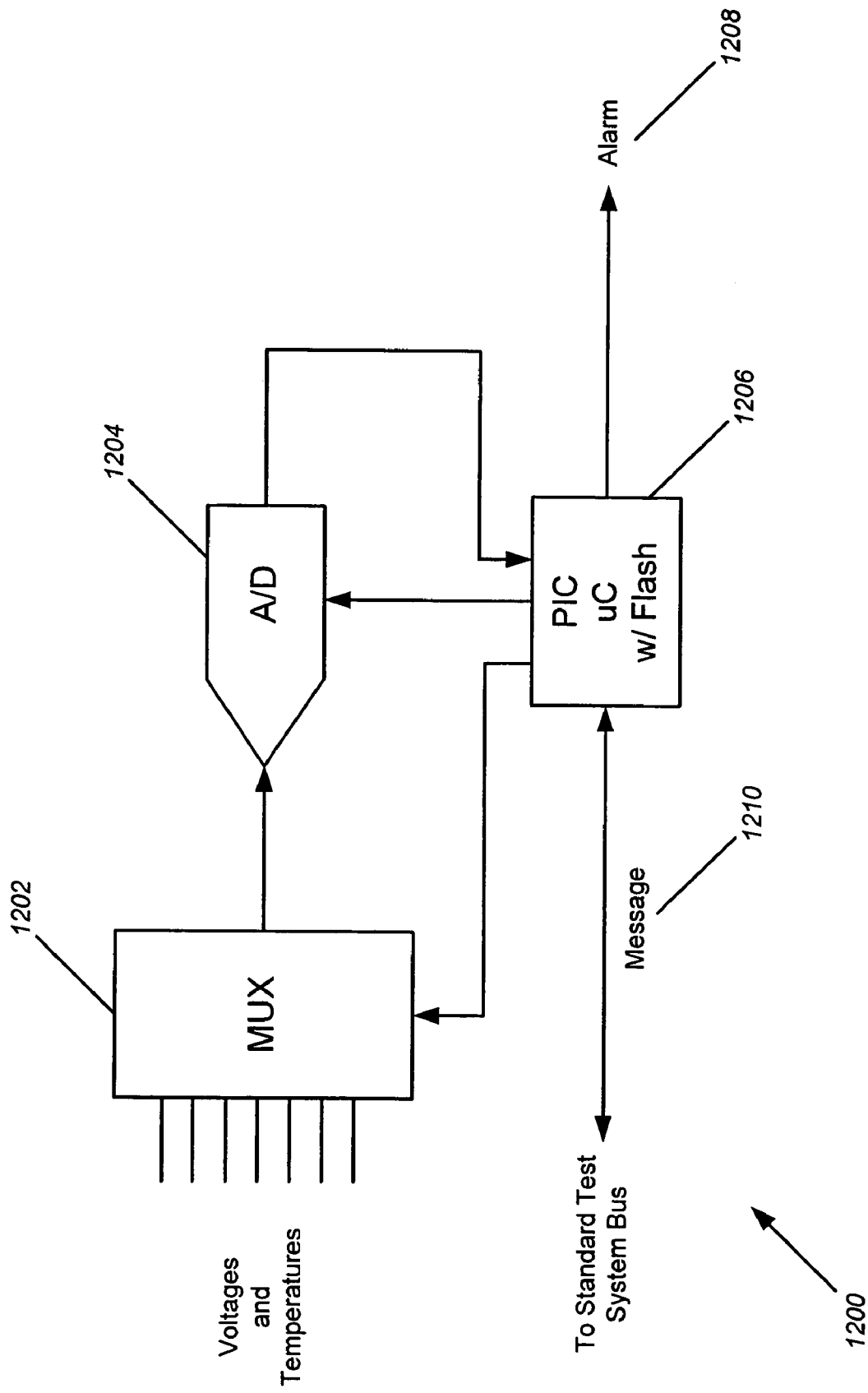
FIG. 12 illustrates an exemplary diagram of a board monitor according to embodiments of the present invention.

FIG. 12 illustrates an exemplary diagram of a board monitor 1200 according to embodiments of the present invention. The board monitor illustrated in FIG. 12 utilizes a separate mux 1202 and A/D 1204 to monitor the same or different voltages and temperatures as the diagnostic circuitry of FIG. 11, but instead of being controlled by a standard test system bus and standard system test software, it is controlled by an on-board microcontroller 1206. The board monitor 1200 has programmed limits so that as it continually loops and takes measurements (a continuous real-time monitor), it can cause an alarm 1208 (for drastic errors) or send a message 1210 (for drifting errors) through the standard test system interface so that the system or site controller will know that something is wrong with the board.

DC/DC block. Referring again to FIG. 5, the DC/DC block 512 may contain DC/DC power supplies to convert the standard tester voltage (e.g. 48V) to the voltages that are needed by the carrier module 500 and the instrument cards 506.

Display tools. With the system of the present invention, a waveform display tool (perhaps the same display tool used for other modules in the system) could be used for the instrument cards on the carrier module. For example, a parameter window may be used to configure the instrument card and change input impedances, AC or DC coupling, voltages, sample rates, dual channels, and the like. These windows would be designed to be similar to other windows for displaying the status of any other module in the system.

Figure 13:
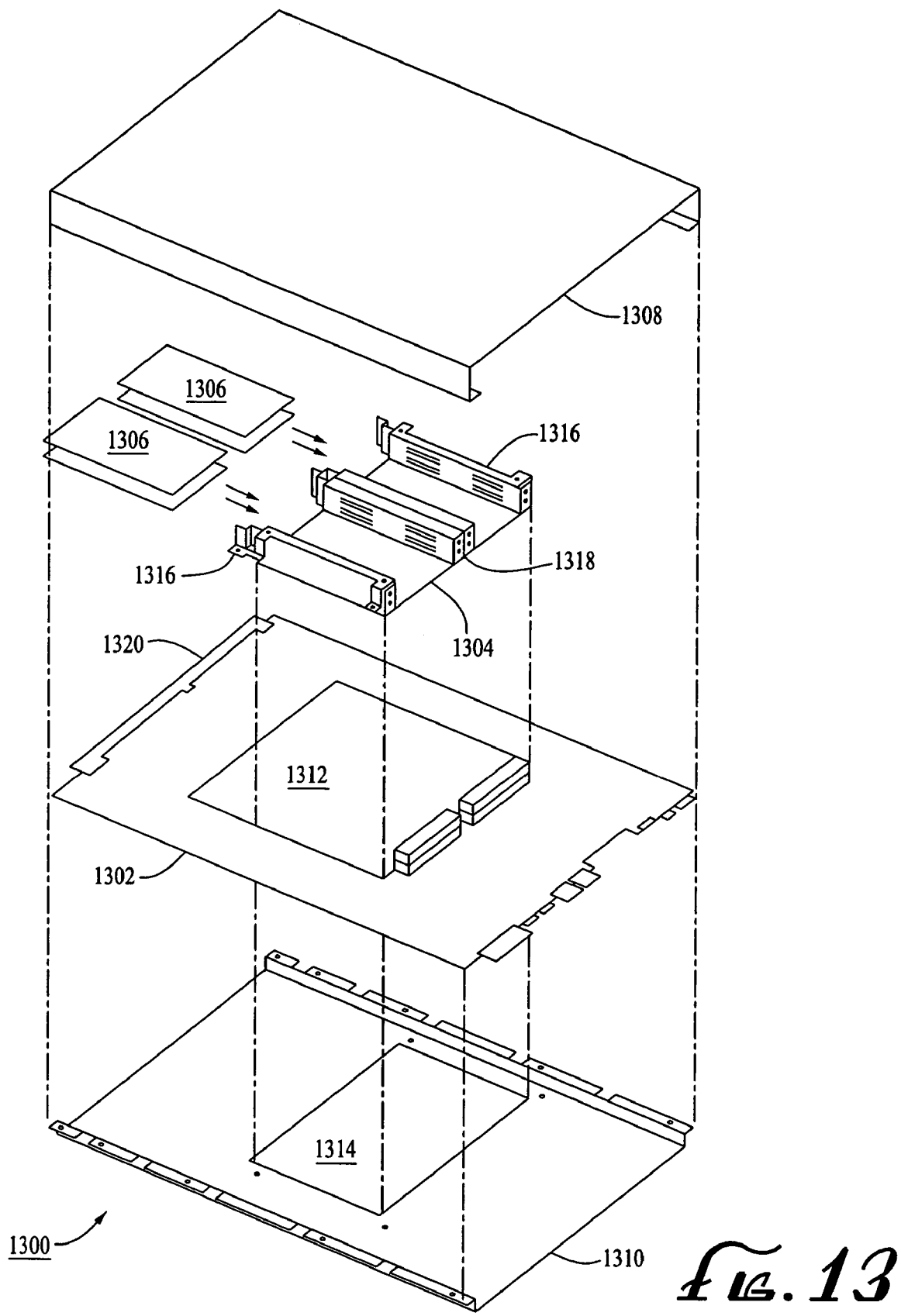
FIG. 13 is an exemplary exploded perspective view of portions of a carrier module assembly capable of supporting two stacks of two non-standard instrument cards according to embodiments of the present invention.

Mechanical features. FIG. 13 is an exemplary exploded perspective view of portions of a carrier module assembly 1300 capable of supporting two stacks of two non-standard instrument cards according to embodiments of the present invention. Because the exemplary carrier module assembly 1300 of FIG. 13 supports two stacks of two non-standard instrument cards, it occupies the width of two conventional test system modules. As noted above, however, in alternative embodiments of the present invention one or more stacks of two or more instrument cards may be employed. If stacks of more than two instrument cards are employed, the carrier module may occupy the width of three or more conventional test system modules, and may plug into three or more module slots in the test head. The exemplary carrier module assembly 1300 includes a PCB 1302, a card guide assembly 1304 into which non-standard instrument cards 1306 may be placed, a top cover 1308 and a bottom cover 1310. PCB 1302 has a cutout 1312, and bottom cover 1310 also has a cutout 1314. Card guide assembly 1304 includes two end rails 1316 and two back-to-back center rails 1318.

As described above, a stack of two non-standard instrument cards 1306 may be too thick to be mounted on top of PCB 1302 without interfering with top cover 1308 and exceeding the width of a conventional test system module. Thus, in embodiments of the present invention, card guide assembly 1304 supports the two stacks of two non-standard instrument cards 1306 within cutout 1312 in PCB 1302. In addition, the card guide assembly 1304 protrudes into the cutout 1314 in the bottom cover. The cutouts 1312 and 1314 may be shaped and sized so that it can accommodate instrument cards of non-standard sizes. It should be understood, however, that cutouts 1312 and 1314 are optional. In alternative embodiments of the present invention, the card guide assembly 1304 may be supported directly on a PCB without a cutout. In such an instance, bottom cover 1310 may also not have a cutout.

Figure 14:
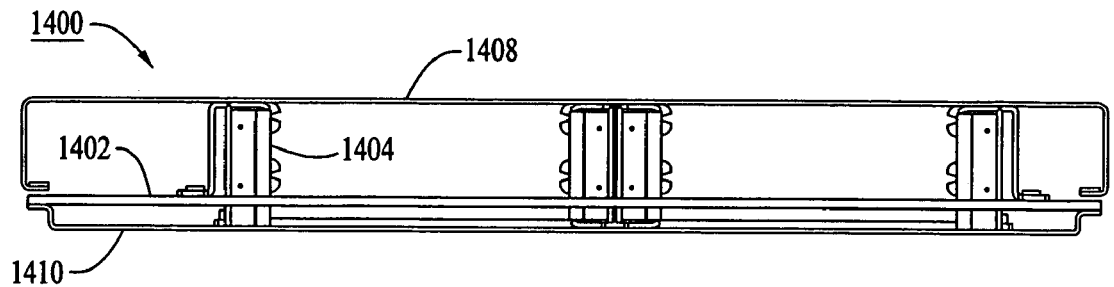
FIG. 14 is a side (elevation) view of an exemplary carrier module assembly capable of supporting two stacks of two non-standard instrument cards according to embodiments of the present invention.

FIG. 14 is a side (elevation) view of an exemplary carrier module assembly 1400 capable of supporting two stacks of two non-standard instrument cards according to embodiments of the present invention. The exemplary carrier module assembly 1400 includes PCB 1402, card guide assembly 1404, top cover 1408 and bottom cover 1410. The carrier module assembly 1400, in particular the top cover 1408, may be designed with openings (not shown in FIG. 14) such that fans mountable on the card guide assembly 1404 (not shown in FIG. 14) can draw in and blow air across the instrument cards (horizontally in FIG. 14) to cool parts on those cards.

Figure 15:
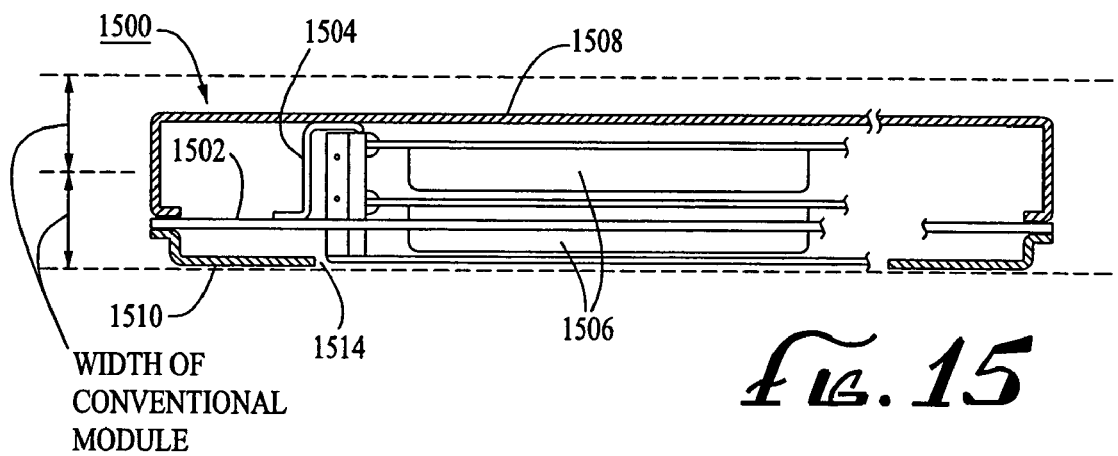
FIG. 15 is a partial side (elevation) view of an exemplary carrier module assembly capable of supporting two stacks of two non-standard instrument cards according to embodiments of the present invention.

FIG. 15 is a partial side (elevation) view of an exemplary carrier module assembly 1500 capable of supporting two stacks of two non-standard instrument cards according to embodiments of the present invention. Because the exemplary carrier module assembly 1500 of FIG. 15 supports two stacks of two non-standard instrument cards, it occupies the width of two conventional test system modules. Such a carrier module assembly 1500 may also contain connections (see reference character 1320 in FIG. 13) for coupling the carrier module assembly to two module slots in the test system. The exemplary carrier module assembly 1500 includes PCB 1502, card guide assembly 1504 into which non-standard instrument cards 1506 are placed, top cover 1508 and bottom cover 1510. PCB 1502 has a cutout (not visible in FIG. 15), and bottom cover 1510 also has a cutout 1514. The card guide assembly 1504 passes through the cutout in the PCB 1502 and protrudes into the cutout 1514 in the bottom cover 1510.

Figure 16:
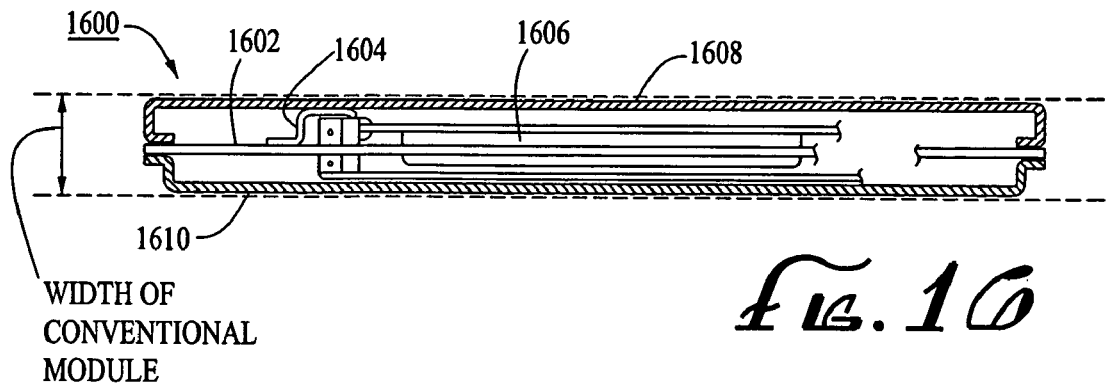
FIG. 16 is a partial side (elevation) view of an exemplary carrier module assembly capable of supporting two side-by-side non-standard instrument cards according to embodiments of the present invention.

FIG. 16 is a partial side (elevation) view of an exemplary carrier module assembly 1600 capable of supporting two side-by-side non-standard instrument cards according to embodiments of the present invention. Because the exemplary carrier module assembly 1600 of FIG. 16 supports two side-by-side non-standard instrument cards, it occupies the width of one conventional test system module. Such a carrier module assembly 1600 may also contain connections (see reference character 1320 in FIG. 13) for coupling the carrier module assembly to one module slot in the test system. The exemplary carrier module assembly 1600 includes PCB 1602, card guide assembly 1604 into which non-standard instrument cards 1606 are placed, top cover 1608 and bottom cover 1610. PCB 1602 has a cutout (not visible in FIG. 16), but bottom cover 1610 does not have a cutout. The card guide assembly 1604 passes through the cutout in the PCB 1602 but does not protrude into the bottom cover 1610.

FIG. 17 is a perspective view of an exemplary card guide assembly 1700 capable of supporting two stacks of two non-standard instrument cards according to embodiments of the present invention. The card guide assembly 1700 of FIG. 17 includes two end rails 1702. The two back-to-back center rails are not shown, but are similar to the end rails 1702. End rails 1702 contain protrusions 1704 that form slots into which non-standard instrument cards (not shown in FIG. 17) may slide. The card guide assembly 1700 also includes backbone 1706 which supports the end rails 1702 and the center rails. The card guide assembly 1700 is capable of being mounted on a PCB so that the backbone 1706 protrudes through the cutout in the PCB and also the cutout in the bottom cover of the carrier module. Fans (not shown in FIG. 17) may be mounted to end rails 1702 to blow air across the instrument cards.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. In a test system for testing integrated circuits, a carrier module for adapting one or more instrument cards to the test system that are non-standard with respect to the test system, the carrier module comprising:
   a non-standard system bus communicatively couplable to the one or more instrument cards, the one or more instrument cards operable in accordance with the non-standard system bus;
   a standard test system bus for controlling functions on the carrier module;
   a bridge communicatively coupled to the non-standard system bus for adapting the non-standard system bus to a bus of a test system controller or for adapting the non-standard system bus to the standard test system bus; and
   an application interface adapter (AIA) communicatively couplable to the one or more instrument cards and to a device under test (DUT) for connecting the one or more instrument cards to the DUT, the AIA for providing clock and control signals to the one or more instrument cards.

2. The carrier module as recited in claim 1, further comprising an application interface adapter (AIA) communicatively couplable to the one or more instrument cards and to a device under test (DUT) for connecting the one or more instrument cards to the DUT, the AIA comprising a removable sub-module that enables a particular AIA to be installed in the carrier module that is configured to operate in conjunction with the particular instrument cards to be installed in the carrier module.

3. The carrier module as recited in claim 1, further comprising an application interface adapter (AIA) communicatively couplable to the one or more instrument cards and to a device under test (DUT) for connecting the one or more instrument cards to the DUT, the AIA including a calibration bus and configurable calibration switches for routing signals from the instrument cards to test system calibration circuitry.

4. The carrier module as recited in claim 1, further comprising an application interface adapter (AIA) communicatively couplable to the one or more instrument cards and to a device under test (DUT) for connecting the one or more instrument cards to the DUT, the AIA including:
   digital pin connections for receiving test signals from digital pins on digital modules within the test system;
   DUT connections for sending test signals to the DUT; and
   channel routing switches for selectively connecting the digital pin connections to the DUT connections and sending test signals from the digital pins on the digital modules to the DUT to perform connectivity or other testing.

5. The carrier module as recited in claim 1, further comprising a diagnostic circuit coupled to the standard test system bus for monitoring voltages, currents, and temperatures on the carrier module and communicating the monitored voltages, currents, and temperatures over the standard test system bus.

6. The carrier module as recited in claim 1, further comprising a system monitor circuit coupled to the standard test system bus, the system monitor circuit including a microcontroller for looping the system monitor circuit to measure voltages, currents, and temperatures on the carrier module, comparing these measurements to predefined limits, and sending alarms or messages over the standard test system bus if a measurement exceeds the predefined limits.

7. The carrier module as recited in claim 1, further comprising a back door data bus coupled between the standard test system bus and the non-standard system bus for reprogramming logic on the carrier module.

8. The carrier module as recited in claim 1, further comprising a local controller located on the carrier module for controlling the non-standard system bus.

9. The carrier module as recited in claim 1, further comprising a printed circuit board (PCB) for supporting the non-standard system bus, the bridge and the standard test system bus.

10. The carrier module as recited in claim 9, further comprising a card guide assembly mountable on the PCB for retaining the one or more instrument cards.

11. The carrier module as recited in claim 10, further comprising:
    a top cover couplable to the PCB for covering the top half of the PCB and the card guide assembly; and
    a bottom cover couplable to the PCB for covering the bottom half of the PCB and the card guide assembly.

12. The carrier module as recited in claim 11, further comprising one or more fans coupled to the card guide assembly for cooling the one or more instrument cards.

13. The carrier module as recited in claim 12, wherein at least one of the top cover and bottom cover include one or more openings to allow the one or more instrument cards to be air cooled by the one or more fans.

14. The carrier module as recited in claim 10, the card guide assembly comprising rails having slots for slidably retaining the instrument cards.

15. The carrier module as recited in claim 9, the PCB having a cutout area for receiving the one or more instrument cards.

16. The carrier module as recited in claim 15, wherein the cutout area is shaped and sized to accommodate instrument cards of non-standard sizes.

17. The carrier module as recited in claim 15, further comprising a card guide assembly mountable on the PCB for retaining the one or more instrument cards within the cutout area in the PCB.

18. The carrier module as recited in claim 17, further comprising:
    a top cover couplable to the PCB for covering the top half of the PCB and the card guide assembly; and
    a bottom cover couplable to the PCB for covering the bottom half of the PCB and the card guide assembly.

19. The carrier module as recited in claim 18, further comprising one or more fans coupled to the card guide assembly for cooling the one or more instrument cards.

20. The carrier module as recited in claim 19, wherein at least one of the top cover and bottom cover include one or more openings to allow the one or more instrument cards to be air cooled by the one or more fans.

21. The carrier module as recited in claim 18 and having a thickness of two or more standard test system modules, the card guide assembly for retaining two or more stacks of two or more instrument cards, and the bottom cover further comprising a cutout area for receiving a portion of the card guide assembly.

22. The carrier module as recited in claim 21, further comprising connections for coupling the carrier module to two or more module slots in the test system.

23. The carrier module as recited in claim 17 and having a thickness of not more than one standard test system module, the card guide assembly for retaining two side-by-side instrument cards.

24. The carrier module as recited in claim 23, further comprising connections for coupling the carrier module to one module slot in the test system.

25. The carrier module as recited in claim 17 and having a thickness of not more than one standard test system module, the card guide assembly for retaining one full size instrument card.

26. The carrier module as recited in claim 25, further comprising connections for coupling the carrier module to one module slot in the test system.

27. The carrier module as recited in claim 17, the card guide assembly comprising rails having slots for slidably retaining the instrument cards.

\* \* \* \* \*